(12) United States Patent
Kouma et al.

(10) Patent No.: US 7,871,687 B2
(45) Date of Patent: Jan. 18, 2011

(54) METHOD OF MAKING MICROSTRUCTURE DEVICE, AND MICROSTRUCTURE DEVICE MADE BY THE SAME

(75) Inventors: Norinao Kouma, Kawasaki (JP);
Yoshihiro Mizuno, Kawasaki (JP);
Hisao Okuda, Kawasaki (JP);
Hiromitsu Soneda, Kawasaki (JP);
Tsuyoshi Matsumoto, Kawasaki (JP);
Osamu Tsuboi, Kawasaki (JP); Ippei Sawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 362 days.

(21) Appl. No.: 11/902,011

(22) Filed: Sep. 18, 2007

(65) Prior Publication Data

US 2008/0075924 A1 Mar. 27, 2008

(30) Foreign Application Priority Data

Sep. 27, 2006 (JP) .............................. 2006-262367

(51) Int. Cl.
*B32B 3/06* (2006.01)
*G02B 7/182* (2006.01)
*H01L 23/58* (2006.01)
*G01P 3/44* (2006.01)
*G01P 15/097* (2006.01)

(52) U.S. Cl. ...................... 428/101; 428/172; 359/883; 257/635; 257/678; 73/504.12; 73/504.14

(58) Field of Classification Search ................... 428/57, 428/58, 101, 172; 359/247, 883; 324/230; 257/48, 98, 225, 432, 621, 635, 678; 73/496, 73/504.04, 404.12, 504.145, 504.12, 504.14
See application file for complete search history.

(56) References Cited

U.S. PATENT DOCUMENTS 5,668,316 A * 9/1997 Iwai et al. ...................... 73/493
5,721,377 A 2/1998 Kurle et al. .............. 73/504.12

FOREIGN PATENT DOCUMENTS

| JP | 09-033557 | 2/1997 |
|---|---|---|
| JP | 2003-19700 | 1/2003 |
| JP | 2004-341364 | 12/2004 |
| JP | 2006-72252 | 3/2006 |

* cited by examiner

*Primary Examiner*—Donald Loney
(74) *Attorney, Agent, or Firm*—Kratz, Quintos & Hanson, LLP

(57) ABSTRACT

A microstructure device is made by processing a material substrate consisting of e.g. a first process layer, a second process layer and a middle layer arranged between the first and the second process layers. The microstructure device includes a first structural part and a second structural part that has a portion facing the first structural part via a gap. The first and the second structural parts are connected to each other by a connecting part extending across the gap. This connecting part is formed in the first process layer to be in contact with the middle layer. The microstructure device also includes a protective part extending from the first structural part toward the second structural part or vice versa. The protective part is formed in the first or second process layer to be in contact with the middle layer.

11 Claims, 29 Drawing Sheets

METHOD OF MAKING MICROSTRUCTURE DEVICE, AND MICROSTRUCTURE DEVICE MADE BY THE SAME

BACKGROUND OF THE INVENTION

1. Field of the Invention

The present invention relates to microstructure devices such as micromirror elements, acceleration sensors, angular-speed sensors and vibration elements made by micromachining technology.

2. Description of the Related Art

In recent years, microstructure devices manufactured by means of micromachining technology are gathering attention, and efforts are being made for making practical application of element devices which have a micro-structure. Microstructure devices include micromirror elements, acceleration sensors, angular-speed sensors and other micro moving devices which have tiny moving parts or vibrating parts therein. Micromirror elements are used in the field of optical disc technology and optical communications technology for example, as a light reflection device. Acceleration sensors and angular-speed sensors find areas of application in the field of attitude control of robots, correction of camera shake, and so on. These micro moving devices generally include a fixed structural part, a moving part relatively displaceable with respect to the fixed structural part, and a connecting part which connects the fixed structural part and the moving part each other. Microstructures as described are disclosed in the following Patent Documents 1 through 3 for example:

Patent Document 1: JP-A-2003-19700
Patent Document 2: JP-A-2004-341364
Patent Document 3: JP-A-2006-72252

FIG. 35 and FIG. 36 show a conventional microstructure device 80 as an example. FIG. 35 is a plan view of the microstructure device 80 whereas FIG. 36 is a sectional view taken in lines XXXVI-XXXVI in FIG. 35.

The microstructure device 80 includes a first structural part 81, a second structural part 82 and a connecting part 83 which connects the first structural part 81 and the second structural part 82 with each other. When the microstructure device 80 of such a principal structure serves as a micro moving device, the first structural part 81 represents the moving part, the second structural part 82 represents the fixed structural part, and the moving part and the fixed structural part are connected with each other by the connecting part 83.

FIG. 37 and FIG. 38 show a process of forming the microstructure device 80. FIG. 37 and FIG. 38 show a section in a series to illustrate how the first structural part 81, the second structural part 82 and the connecting part 83 are formed. The section featured in the figures is a conceptual composite collected from a plurality of fragmentary sections of a row material substrate (wafer) to which a series of manufacturing operations are made.

In the manufacture of the microstructure device 80, first, a material substrate 90 as shown in FIG. 37(a) is prepared. The material substrate 90 is an SOI (Silicon on Insulator) wafer, and has a laminated structure including a silicon layer 91, a silicon layer 92 and an insulation layer 93 between the silicon layers. The insulation layer 93 has a thickness of about 1 μm.

Next, as shown in FIG. 37(b), anisotropic dry etching is performed to the silicon layer 91 via a predetermined mask, to form structures to be built on the silicon layer 91 (i.e. the first structural part 81, part of the second structural part 82, and the connecting part 83). In this step, a predetermined etching apparatus equipped with a vacuum chamber is used to perform the dry etching in the vacuum chamber under predetermined vacuum conditions.

Next, as shown in FIG. 37(c) and FIG. 37(d), a sub-carrier 94 is bonded onto the silicon layer 91 side of the material substrate 90 via the bonding member 95. The bonding member 95 is provided by resist, grease or sealant for example. In this step, the material substrate 90 and the sub-carrier 94 are bonded together under heat and pressure. A purpose of bonding the sub-carrier 94 in such a way is to prevent damage to the material substrate 90 and to the etching apparatus in the next manufacturing step. In the next manufacturing step, etching is performed to the silicon layer 92 in the vacuum chamber of the etching apparatus. In this process, mechanical strength of the material substrate 90 decreases substantially because of the etching performed to the silicon layer 92, with the silicon layer 91 having already been etched. The sub-carrier 94 serves as a reinforcing member for the material substrate 90, and prevents the material substrate 90 from breaking. If the material substrate 90 breaks in the vacuum chamber, broken pieces can damage the etching apparatus. Therefore, damage prevention of the material substrate 90 by the sub-carrier 94 also contributes to damage prevention of the apparatus.

In the manufacture of the microstructure device 80, next, as shown in FIG. 38(a), anisotropic dry etching is performed to the silicon layer 92 via a predetermined mask, to form a structure to be built on the silicon layer 92 (i.e. part of the second structural part 82). Like the step described above with reference to FIG. 37(b), this step also employs a predetermined etching apparatus equipped with a vacuum chamber to perform the dry etching in the vacuum chamber under predetermined vacuum conditions.

Next, as shown in FIG. 38(b), the material substrate 90 is separated from the sub-carrier 94. This step is performed outside of the vacuum chamber of the etching apparatus. Thereafter, as shown in FIG. 38(c), the insulation layer 93 is subjected to isotropic etching in order to remove exposed portions of the insulation layer 93. Through the above-described process, the microstructure device 80 is completed.

However, in the process of making the microstructure device 80, the connecting part 83 is likely to be broken after the step described with reference to FIG. 38(a).

In the step described with reference to FIG. 37(b), the silicon layer 91 is partially etched off, exposing part of the insulation layer 93 in the silicon layer 91. Then, as the step in FIG. 38(a) proceeds or finishes, the insulation layer 93 is also exposed in the silicon layer 92, with portions S (double-side exposed portions) of the insulation layer 93 which are bonded neither to the silicon layer 91 nor to the silicon layer 92. The insulation layer 93 is substantially thin and the portions S are brittle enough to fracture easily.

During the step in FIG. 38(a) which is performed in the vacuum chamber, and until the separation thereafter of the material substrate 90 from the sub-carrier 94 as shown in FIG. 38(b) outside the vacuum chamber, a constant pressure (e.g. a predetermined level of vacuum) is maintained on the surface of the insulation layer 93 exposed in the silicon layer 91. On the contrary, the surface of the insulation layer 93 exposed in the silicon layer 92 is subject to pressure changes: During the step in FIG. 38(a), the surface is under a constant level of vacuum which is set for and maintained in the vacuum chamber, but the surface comes under a normal atmospheric pressure after the vacuum in the vacuum chamber is broken. As a result, the two surfaces of the portions S in the insulation layer 93 are pressed by substantially different pressures at least in one of the two occasions i.e. during the step in FIG. 38(a) and for a certain period of time thereafter. The substantial pressure difference can be a cause of the fracture in the portions S.

There is another cause if the bonding member 95 is formed of a volatile material. Under the bond between the material substrate 90 and the sub-carrier 94 in FIG. 38(a), spaces in the silicon layer 91 backed by the insulation layer 93 is filled with gas as the bonding member 95 evaporates, and as the pressure increases in the spaces, risk of fracture increases for the insulation layer 93, i.e. the portions S.

The fracture occurs anywhere in the portions S (double-side exposed portion) of the insulation layer 93. For example, once a fracture Z occurs as shown in FIG. 39(a), the fracture Z often extends as shown in FIG. 39(b) for example, within the portion S, and then further in the insulation layer 93, crossing the area of connection with the connecting part 83. When the fracture Z crosses the area of the insulation layer 93 connected with the connecting part 83, an impact acts upon the connecting part 83, destroying the connecting part 83.

As described, the conventional technique is faced by challenges in manufacturing microstructure devices which include the first structural part, the second structural part and the connecting part connecting the first and the second structural part.

SUMMARY OF THE INVENTION

The present invention has been proposed under the above-described circumstances, and it is therefore an object of the present invention to provide a method suitable for manufacturing a microstructure device which includes the first structural part, the second structural part and the connecting part connecting the first and the second structural parts, as well as to provide the microstructure device made thereby.

A first aspect of the present invention provides a method of making a microstructure device including a first structural part, a second structural part having a portion opposed to the first structural part, and a connecting part connecting the first and the second structural parts, from a material substrate having a laminated structure including a first process layer, a second process layer and a middle layer between the first process layer and the second process layer. The method includes a first processing step and a second processing step. In the first processing step, etching is performed to the first process layer whereby formation is made for: a first-structural-part component and a second-structural-part component opposed to each other via a separation gap where the middle layer makes partial exposure; a connecting part connecting the first and the second-structural-part components with each other across the separation gap while being in contact with the middle layer; and a protective part extending from the first-structural-part component or the second-structural-part component into the separation gap while being in contact with the middle layer. In the second processing step, etching is performed to the second process layer whereby at least a portion of the middle layer exposed to the separation gap on the first process layer side, and a portion of the middle layer contacted by the connecting part are exposed to the second process layer side. In the present invention, the first-structural-part component is a portion constituting at least part of the first structural part whereas the second-structural-part component is a portion constituting at least part of the second structural part.

According to the first processing step in the present method, as described above, a protective part which extends from the first-structural-part component or the second-structural-part component into the separation gap while being in contact with the middle layer is formed in the first process layer, along with the connecting part which connects the first and the second-structural-part components across the separation gap while being in contact with the middle layer. As a result, breakage of the connecting part which is in contact with the middle layer is reduced under a circumstance resulted from the second processing step where the middle layer is formed with a portion (double-side exposed portion) which is exposed both to the separation gap on the first process layer side and to the second process layer side. If a fracture occurs locally anywhere in the double-side exposed portion of the middle layer, presence of the protective part which is in contact with the middle layer may successfully prevent the fracture from spreading. As a growing fracture runs across an area of the middle layer contacted by the protective part extended into the separation, an impact reaches the protective part, and the protective part absorbs at least part of the energy necessary for the fracture to grow further. With the presence of the protective part which can provide the above-described function, breakage probability of the connecting part which crosses the separation gap while being in contact with the middle layer is decreased. The breakage probability of the connecting part tends to decrease if the protective part is closer to the connecting part. Also, the breakage probability of the connecting part tends to decrease with increase in the number of protective parts provided. As described, the present method decreases breakage probability of the connecting part. Therefore, the present method is suitable for manufacturing microstructure devices which include a connecting part that connects the first structural part and the second structural part.

A second aspect of the present invention provides a method of making a microstructure device including a first structural part, a second structural part having a portion opposed to the first structural part, and a connecting part connecting the first and the second structural parts, from a material substrate having a laminated structure including a first process layer, a second process layer and a middle layer between the first process layer and the second process layer. The method includes a first processing step and a second processing step. In the first processing step, etching is performed to the first process layer whereby formation is made for: a first-structural-part component and a second-structural-part component opposed to each other via a separation gap where the middle layer makes partial exposure; a connecting part connecting the first and the second-structural-part components with each other across the separation gap while being in contact with the middle layer; a first protective part extending from the first-structural-part component into the separation gap while being in contact with the middle layer; and a second protective part extending from the second-structural-part component into the separation gap while being in contact with the middle layer. In the second processing step, etching is performed to the second process layer whereby at least a portion of the middle layer exposed to the separation gap on the first process layer side, and a portion of the middle layer contacted by the connecting part are exposed to the second process layer side.

According to the first processing step in the present method, as described above, formation is made in the first process layer for: a first protective part which extends from the first-structural-part component into the separation gap while being in contact with the middle layer; and a second protective part which extends from the second-structural-part component into the separation gap while being in contact with the middle layer; along with the connecting part which connects the first and the second-structural-part components across the separation gap while being in contact with the middle layer. As a result, breakage of the connecting part which is in contact with the middle layer is reduced under a circumstance resulted from the second processing step where the middle layer is formed with a portion (double-side exposed portion) which is exposed both to the separation gap on the first process layer side and to the second process layer side. Like in the method according to the first aspect of the present invention described earlier, here again, presence of the protective parts decreases breakage probability of the connecting part in the present method according to the second aspect of the present invention. Therefore, the present method is also suitable for manufacturing microstructure devices which include a connecting part that connects the first structural part and the second structural part.

According to the first and the second aspects of the present invention, the second processing step may also expose a portion of the middle layer contacted by the protective part in the first process layer, to the second process layer side.

According to a preferred embodiment of the first and the second aspects of the present invention, the second processing step includes further formation in the second process layer of: an additional first-structural-part component and/or an additional second-structural-part component; and a protective part extending from the additional first-structural-part component or the additional second-structural-part component while being in contact with the middle layer. These protective parts which are in contact with the middle layer and are formed in the second processing step also contribute to reduced breakage of the connecting part which is in contact with the middle layer.

According to another preferred embodiment of the first and the second aspects of the present invention, the second processing step includes further formation in the second process layer of: an additional first-structural-part component and an additional second-structural-part component; a first protective part extending from the additional first-structural-part component while being in contact with the middle layer; and a second protective part extending from the additional second-structural-part component while being in contact with the middle layer. These protective parts which are in contact with the middle layer and are formed in the second processing step also contribute to reduced breakage of the connecting part which is in contact with the middle layer.

A third aspect of the present invention provides a method of making a microstructure device including a first structural part, a second structural part having a portion opposed to the first structural part, and a connecting part connecting the first and the second structural parts, from a material substrate having a laminated structure including a first process layer, a second process layer and a middle layer between the first process layer and the second process layer. The method includes a first processing step and a second processing step. In the first processing step, etching is performed to the first process layer whereby formation is made for: a first-structural-part component and a second-structural-part component opposed to each other via a separation gap where the middle layer makes partial exposure; and a connecting part connecting the first and the second-structural-part components with each other across the separation gap while being in contact with the middle layer. In the second processing step, etching is performed to the second process layer: for formation of an additional first-structural-part component and/or an additional second-structural-part component, and a protective part extending from the additional first-structural-part component or the additional second-structural-part component while being in contact with the middle layer; and for exposure of a portion of the middle layer exposed to the separation gap on the first process layer side, and a portion of the middle layer contacted by the connecting part, to the second process layer side.

According to the second processing step in the present method, as described above, formation is made in the second process layer, for a protective part which extends from the additional first-structural-part component or the additional second-structural-part component while being in contact with the middle layer. This protective part is formed in contact with the second process layer side of the middle layer, at a portion that is exposed to the separation gap on the first process layer side. As a result, breakage of the connecting part which is in contact with the middle layer is reduced under a circumstance where the middle layer is formed with a portion (double-side exposed portion) which is exposed both to the separation gap on the first process layer side and to the second process layer side. Like in the method according to the first aspect of the present invention described earlier, here again, presence of the protective part decreases breakage probability of the connecting part in the present method according to the third aspect of the present invention. Therefore, the present method is also suitable for manufacturing microstructure devices which include a connecting part that connects the first structural part and the second structural part.

A fourth aspect of the present invention provides a method of making a microstructure device including a first structural part, a second structural part having a portion opposed to the first structural part, and a connecting part connecting the first and the second structural parts, from a material substrate having a laminated structure including a first process layer, a second process layer and a middle layer between the first process layer and the second process layer. The method includes a first processing step and a second processing step. In the first processing step, etching is performed to the first process layer whereby formation is made for: a first-structural-part component and a second-structural-part component opposed to each other via a separation gap where the middle layer makes partial exposure; and a connecting part connecting the first and the second-structural-part components with each other across the separation gap while being in contact with the middle layer. In the second processing step, etching is performed to the second process layer: for formation of an additional first-structural-part component and an additional second-structural-part component, a first protective part extending from the additional first-structural-part component while being in contact with the middle layer, and a second protective part extending from the additional second-structural-part component while being in contact with the middle layer; and for exposure of a portion of the middle layer exposed to the separation gap on the first process layer side, and a portion of the middle layer contacted by the connecting part, to the second process layer side.

According to the second processing step in the present method, as described above, formation is made in the second process layer, for a first protective part which extends from the additional first-structural-part component while being in contact with the middle layer, and a second protective part which extends from the additional second-structural-part component while being in contact with the middle layer. These protective parts are formed in contact with the second process layer side of the middle layer, at portions that are exposed to the separation gap on the first process layer side. As a result, breakage of the connecting part which is in contact with the middle layer is reduced under a circumstance where the middle layer is formed with a portion (double-side exposed portion) which is exposed both to the separation gap on the first process layer side and to the second process layer side. Like in the method according to the first aspect of the present invention described earlier, here again, presence of the protective part decreases breakage probability of the connecting part in the present method according to the fourth aspect of the present invention. Therefore, the present method is also suitable for manufacturing microstructure devices which include a connecting part that connects the first structural part and the second structural part.

Each of the manufacturing methods according to the first through the fourth aspects of the present invention preferably includes: a step after the first processing step and before the second processing step, of bonding a support substrate to the first process layer side of the material substrate; and a step of separating the material substrate from the support substrate after the second processing step. There are cases where performing the bonding step helps perform the second processing step that follows, appropriately.

In the bonding step according to the first through the fourth aspects of the present invention, preferably, the support substrate is bonded to the first process layer side of the material substrate via a bonding material such as resin composition. Such an arrangement is suitable to perform the bonding step appropriately.

A fifth aspect of the present invention provides a microstructure device made from a material substrate having a laminated structure including a first process layer, a second process layer and a middle layer between the first process layer and the second process layer. The microstructure device includes a first structural part, a second structural part, a connecting part and a protective part. The second structural part has a portion opposed to the first structural part via a gap. The connecting part is formed in the first process layer, at a place contacted by the middle layer, and connects the first structural part and the second structural part across the gap. The protective part is formed in the first process layer or the second process layer, at a place contacted by the middle layer, and extends from the first structural part toward the second structural part or from the second structural part toward the first structural part.

The present microstructure device is made by a method according to the first or the third aspect of the present invention. According to such a microstructure device, the same technical advantages are enjoyed as described earlier in relation to the first or the third aspect during the manufacturing process.

A sixth aspect of the present invention provides a microstructure device made from a material substrate having a laminated structure including a first process layer, a second process layer and a middle layer between the first process layer and the second process layer. The microstructure device includes a first structural part, a second structural part, a connecting part, a first protective part and a second protective part. The second structural part has a portion opposed to the first structural part via a gap. The connecting part is formed in the first process layer, at a place contacted by the middle layer, and connects the first structural part and the second structural part across the gap. The first protective part is formed in the first process layer or the second process layer, at a place contacted by the middle layer, and extends from the first structural part toward the second structural. The second protective part is formed in the first process layer or the second process layer, at a place contacted by the middle layer, and extends from the second structural part toward the first structural part.

The present microstructure device is made by a method according to the second or the fourth aspect of the present invention. According to such a microstructure device, the same technical advantages are enjoyed as described earlier in relation to the second or the fourth aspect, during the manufacturing process.

In the fifth and the six aspect of the present invention, the connecting part may be thinner than the first structural part and the second structural part. A thinner connecting part has a lower torsional stiffness and bending stiffness. The protective part may also be thinner than the first structural part and the second structural part.

Preferably, the protective part is thicker than the connecting part. A thicker protective part is more preferable in the reduction of connecting part breakage probability. Preferably, the protective part is wider than the connecting part. A wider protective part is more preferable in the reduction of connecting part breakage probability.

Preferably, the first structural part is a moving part, and the second structural part is a fixed structural part. Such an arrangement as this allows a microstructure device according to the present invention to be configured as a micro moving device. Preferably, the microstructure device according to the fifth and the sixth aspect of the present invention further includes a first comb-teeth electrode fixed to the moving part, and a second comb-teeth electrode fixed to the fixed structural part. The second comb-teeth electrode is brought into facing relation to the first comb-teeth electrode.

According to a preferred embodiment, the first comb-teeth electrode and the second comb-teeth electrode constitute driving force generation means capable of generating electrostatic attraction between the first and the second comb-teeth electrodes. Such an arrangement as this enables to utilize the electrostatic attraction as a driving force to displace the moving part relatively to the fixed structural part.

According to another preferred embodiment, the first comb-teeth electrode and the second comb-teeth electrode constitute detection means for detecting electrostatic capacity change between the first and the second comb-teeth electrodes. Such an arrangement as this enables to know a relative amount of displacement of the second comb-teeth electrode with respect to the first comb-teeth electrode, i.e. a relative amount of displacement of the moving part with respect to the fixed structural part, based on the electrostatic capacity change.

In the fifth and the sixth aspects of the present invention, the connecting part may serve as a supporting part for temporarily fixing the moving part to the fixed structural part. This supporting part provides connection or reinforces connection between the moving part and the fixed structural part until it is cut. It is cut before the micro moving device is utilized.

DETAILED DESCRIPTION OF THE PREFERRED EMBODIMENTS

Figure 1:
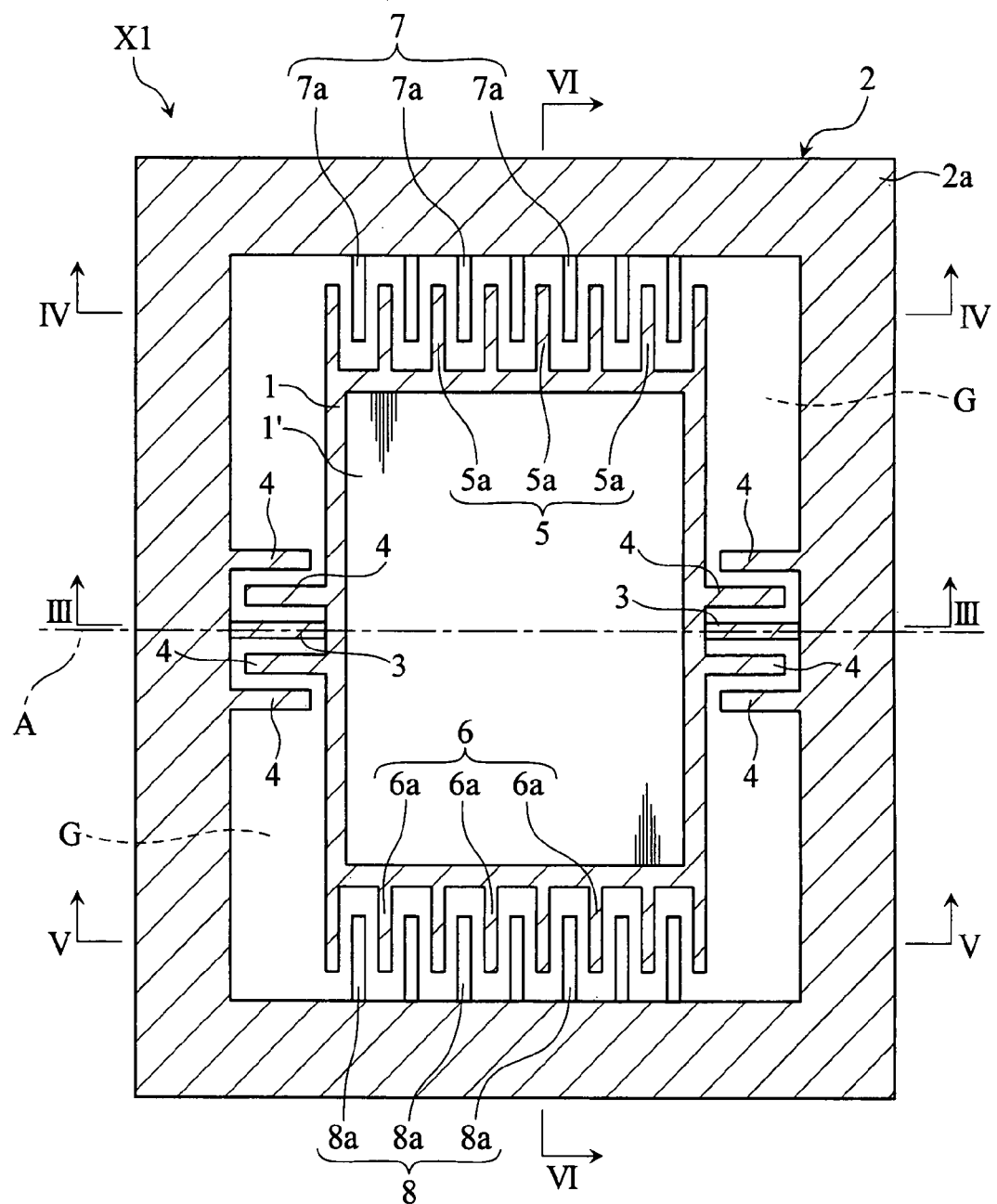
FIG. 1 is a plan view of a micromirror element according to a first embodiment of the present invention.
Figure 2:
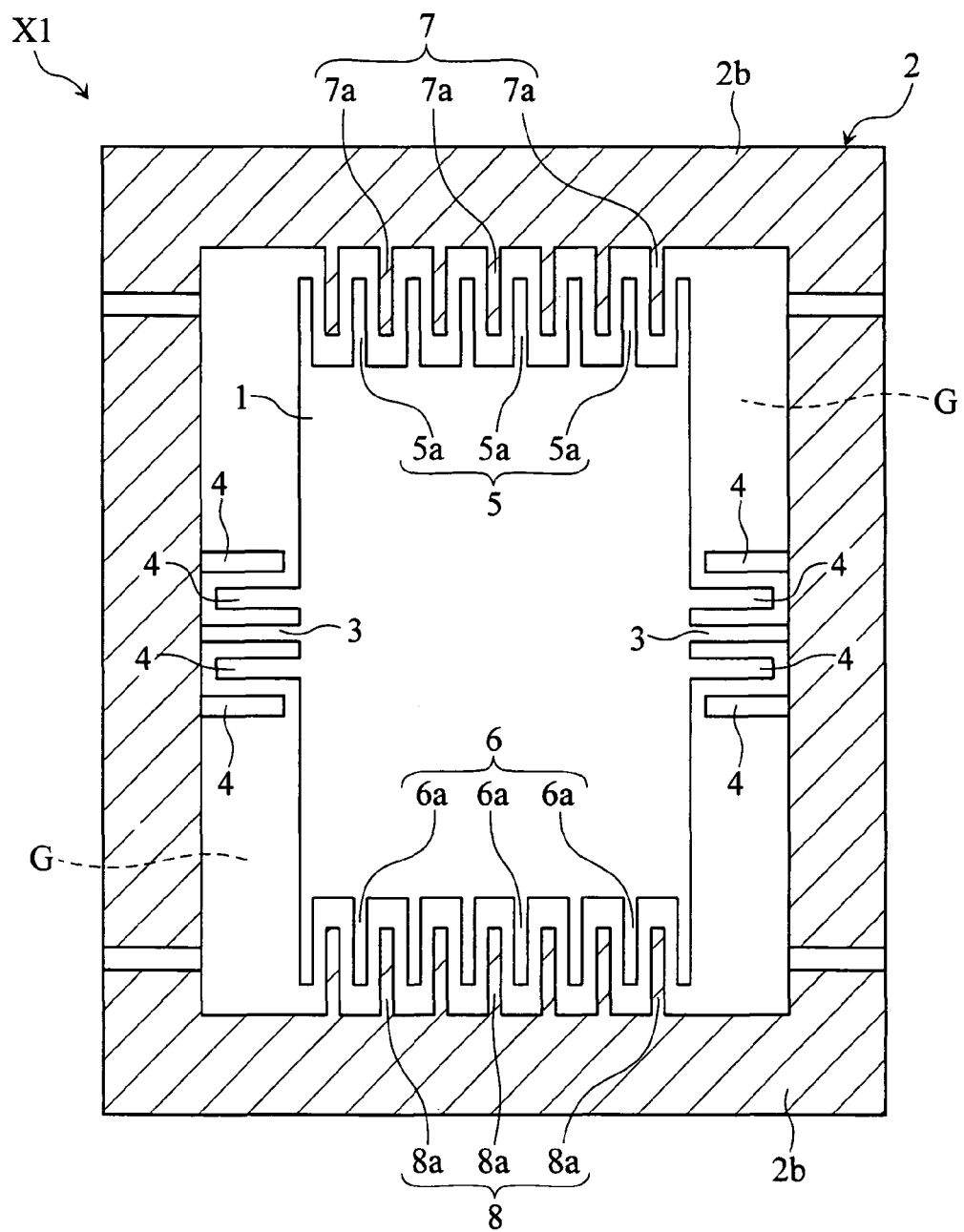
FIG. 2 is another plan view of a micromirror element according to the first embodiment of the present invention.
Figure 3:
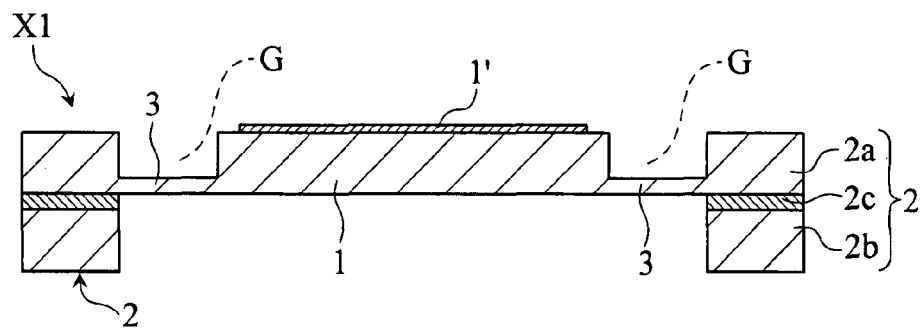
FIG. 3 is a sectional view taken in lines III-III in FIG. 1.

FIG. 1 through FIG. 6 show a micromirror element X1 according to a first embodiment of the present invention. FIG. 1 is a plan view of the micromirror element X1, FIG. 2 is another plan view of the micromirror element X1. FIG. 3 through FIG. 6 are sectional views taken in lines III-III, IV-IV, V-V, and VI-VI respectively.

The micromirror element X1 includes a moving part 1, a frame 2, a pair of connecting parts 3, a plurality of protective parts 4, and comb-teeth electrodes 5, 6, 7, 8, and is manufactured by micromachining technology such as MEMS technology, from a material substrate provided by an SOI (silicon on insulator) substrate. The material substrate has a laminated structure provided by a first and a second silicon layers and an insulation layer between the silicon layers. Each silicon layer has a predetermined electrical conductivity due to doping with an impurity. The above mentioned parts in the micromirror element X1 are primarily formed out of the first silicon layer and/or the second silicon layer. For the sake of illustrative clarity, however, hatching is made in FIG. 1 on those portions which are derived from the first silicon layer and are higher than the insulation layer toward the viewer of the figure. Likewise, in FIG. 2, hatching is made on those portions which are derived from the second silicon layer and are higher than the insulation layer toward the viewer of the figure.

The moving part 1 is derived from the first silicon layer, and has a surface provided with a mirror surface 1' capable of reflecting light.

As shown in FIG. 1, the frame 2 surrounds the moving part 1, and as shown in FIG. 3 through FIG. 6, has a laminated structure which includes a first layer 2a, a second layer 2b and an insulation layer 2c between them. The first layer 2a is a portion derived from the first silicon layer whereas the second layer 2b is a portion derived from the second silicon layer.

Figure 7:
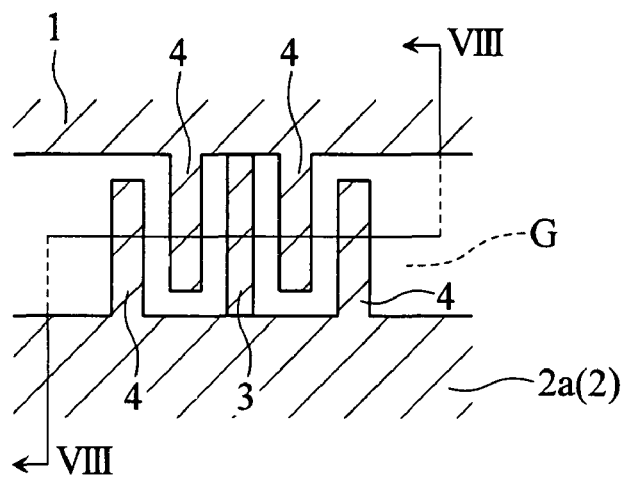
FIG. 7 is an enlarged partial plan view of the micromirror element in FIG. 1.
Figure 8:
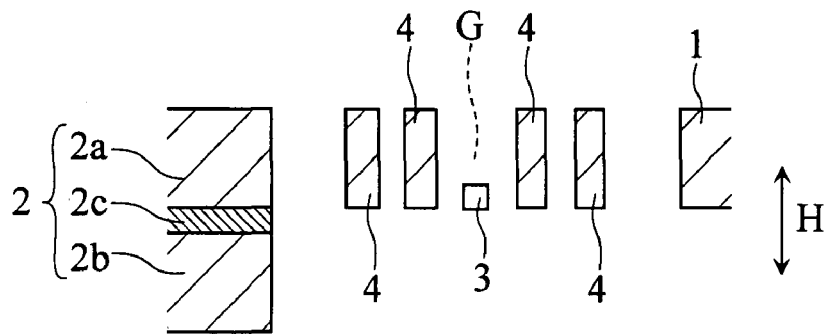
FIG. 8 is a sectional view taken in lines VIII-VIII in FIG. 7.

Each of the connecting parts 3 is a portion derived from the first silicon layer, and as shown in FIG. 1, FIG. 2 and FIG. 7, it connects the moving part 1 and the frame 2 across a gap G between the moving part 1 and the frame 2. Each connecting part 3 connects with the moving part 1, and with the first layer 2a of the frame 2. The connecting part 3 provides electrical connection between the moving part 1 and the first layer 2a. Also, as shown in FIG. 8, each connecting part 3 in the present embodiment is thinner than the moving part 1 and the first layer 2a of the frame 2 in a thickness direction H of the element. The pair of connecting parts 3 provides a pivotal axis A for pivotal displacement or pivotal movement of the moving part 1 with respect to the frame 2.

Each of the protective parts 4 is a portion derived from the first silicon layer, and as shown in FIG. 1 and FIG. 7, extends from the first layer 2a in the moving part 1 or in the frame 2, into the gap G. In the present embodiment, each connecting part 3 is provided closely thereto, with two protective parts 4 extending from the moving part 1 and two protective parts 4 extending from the first layer 2a. FIG. 1 shows that the protective parts 4 are disposed on both sides of and parallel to the connecting part 3. As shown in FIG. 8, each protective part 4 in the present embodiment has the same thickness as the moving part 1 and the first layer 2a of the frame 2 in the thickness direction H of the element. Further, each protective part 4 is wider than the connecting part 3.

Figure 4:
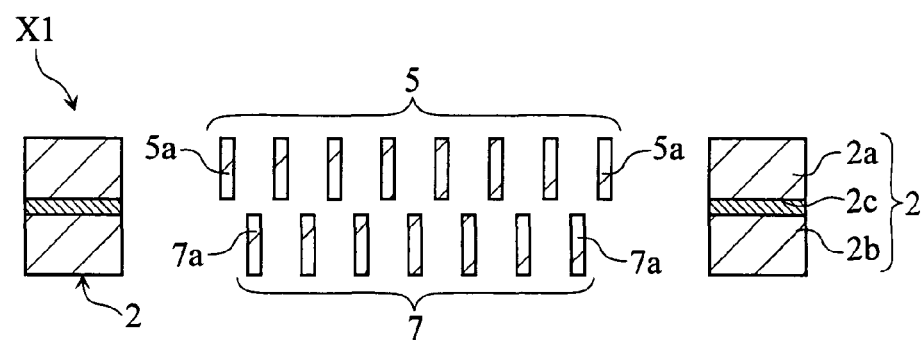
FIG. 4 is a sectional view taken in lines IV-IV in FIG. 1.
Figure 6:
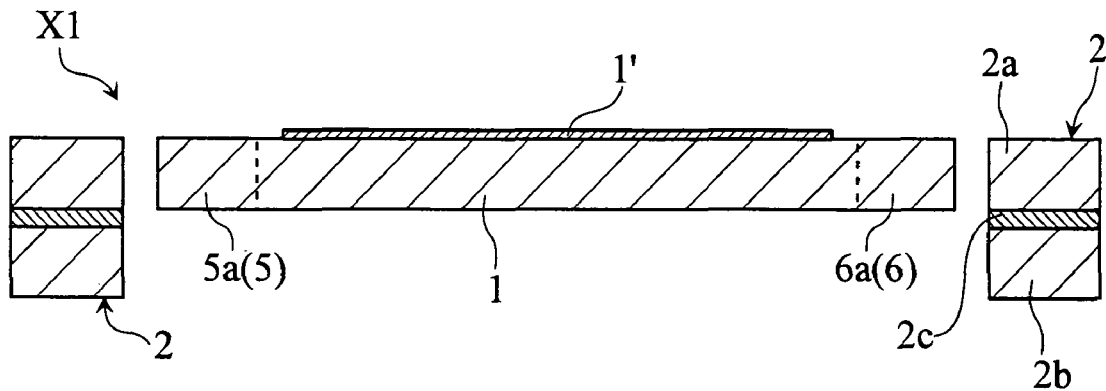
FIG. 6 is a sectional view taken in lines VI-VI in FIG. 1.

The comb-teeth electrode 5 has a plurality of electrode teeth 5a derived from the first silicon layer, and is fixed to the moving part 1. As shown in FIG. 1, FIG. 2 and FIG. 6, each of the electrode teeth 5a extends from the moving part 1. As shown in FIG. 1, FIG. 2 and FIG. 4, the electrode teeth 5a are parallel to each other.

Figure 5:
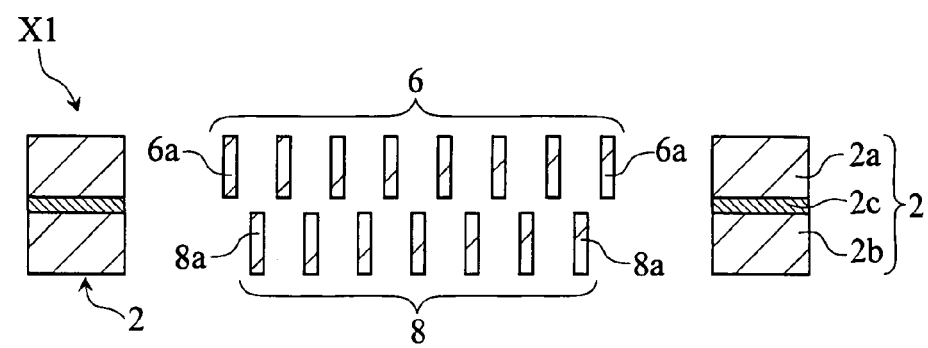
FIG. 5 is a sectional view taken in lines V-V in FIG. 1.

The comb-teeth electrode 6 has a plurality of electrode teeth 6a derived from the first silicon layer, and is fixed to the moving part 1 to face away from the comb-teeth electrode 5. As shown in FIG. 1, FIG. 2 and FIG. 6, each of the electrode teeth 6a extends from the moving part 1. As shown in FIG. 1, FIG. 2 and FIG. 5, the electrode teeth 6a are parallel to each other. The comb-teeth electrode 6 is electrically connected with the comb-teeth electrode 5 via the moving part 1.

The comb-teeth electrode 7 has a plurality of electrode teeth 7a derived from the second silicon layer, and as shown in FIG. 2, fixed to the second layer 2b of the frame 2. Each of the electrode teeth 7a extends from the second layer 2b. As shown in FIG. 1, FIG. 2 and FIG. 4, the electrode teeth 7a are parallel to each other. The comb-teeth electrode 7 works with the comb-teeth electrode 5 to generate electrostatic attraction (driving force). A pair of comb-teeth electrodes 5, 7 constitutes an actuator for the micromirror element X1.

The comb-teeth electrode 8 has a plurality of electrode teeth 8a derived from the second silicon layer, and fixed to the second layer 2b of the frame 2 as shown in FIG. 2. Each of the electrode teeth 8a extends from the second layer 2b. As shown in FIG. 1, FIG. 2 and FIG. 5, the electrode teeth 8a are parallel to each other. The comb-teeth electrode 8 works with the comb-teeth electrode 6 to generate electrostatic attraction (driving force). A pair of comb-teeth electrodes 6, 8 constitutes an actuator for the micromirror element X1. The portion in the second layer 2b of the frame 2 where the comb-teeth electrode 8 is fixed to is electrically separated from the portion of the second layer 2b where the comb-teeth electrode 7 is fixed to. Therefore, the comb-teeth electrodes 7, 8 are electrically separated from each other.

According to the micromirror element X1 it is possible to pivot the moving part 1 about the pivotal axis A by applying a predetermined electric potential as necessary, to the comb-teeth electrodes 5 through 8. Electric potential application to the comb-teeth electrodes 5, 6 can be achieved through the first layer 2a of the frame 2, each connecting part 3 and the moving part 1. The comb-teeth electrodes 5, 6 are grounded for example. On the other hand, electric potential application to the comb-teeth electrode 7 can be achieved through part of the second layer 2b in the frame 2 whereas electric potential application to the comb-teeth electrode 8 can be achieved through a different part of the second layer 2b. Since the comb-teeth electrodes 7, 8 are electrically separated from each other, electric potential application to the comb-teeth electrodes 7, 8 can be made independently from each other.

When a predetermined electric potential is given to each of the comb-teeth electrodes 5, 7, thereby generating a desirable electrostatic attraction between the comb-teeth electrodes 5, 7, the comb-teeth electrode 5 is drawn to the comb-teeth electrode 7. As a result, the moving part 1 pivots about the pivotal axis A to a displacement angle where the electrostatic attraction is balanced by a total of torsional resistances of the twisted connecting parts 3. The amount of pivotal displacement in such a pivotal movement can be controlled by varying the amount of electric potential applied to the comb-teeth electrodes 5, 7. When the electrostatic attraction between the comb-teeth electrodes 5, 7 is turned off, each connecting part 3 releases its torsional stress and returns to its natural state.

Likewise, when a predetermined electric potential is given to each of the comb-teeth electrodes 6, 8, thereby generating a desirable electrostatic attraction between the comb-teeth electrodes 6, 8, the comb-teeth electrode 6 is drawn to the comb-teeth electrode 8. As a result, the moving part 1 pivots about the pivotal axis A in the reverse direction from the pivotal movement described in the previous paragraph, to a displacement angle where the electrostatic attraction is balanced by a total of torsional resistances of the twisted connecting parts 3. The amount of pivotal displacement in such a pivotal movement can be controlled by varying the amount of electric potential applied to the comb-teeth electrodes 6, 8. When the electrostatic attraction between the comb-teeth electrodes 6, 8 is turned off, each connecting part 3 releases its torsional stress and returns to its natural state.

According to the micromirror element X1, it is possible to change light reflection directions of the mirror surface 1' formed on the moving part 1, by pivotally driving the moving part 1 as outlined above.

Figure 9:
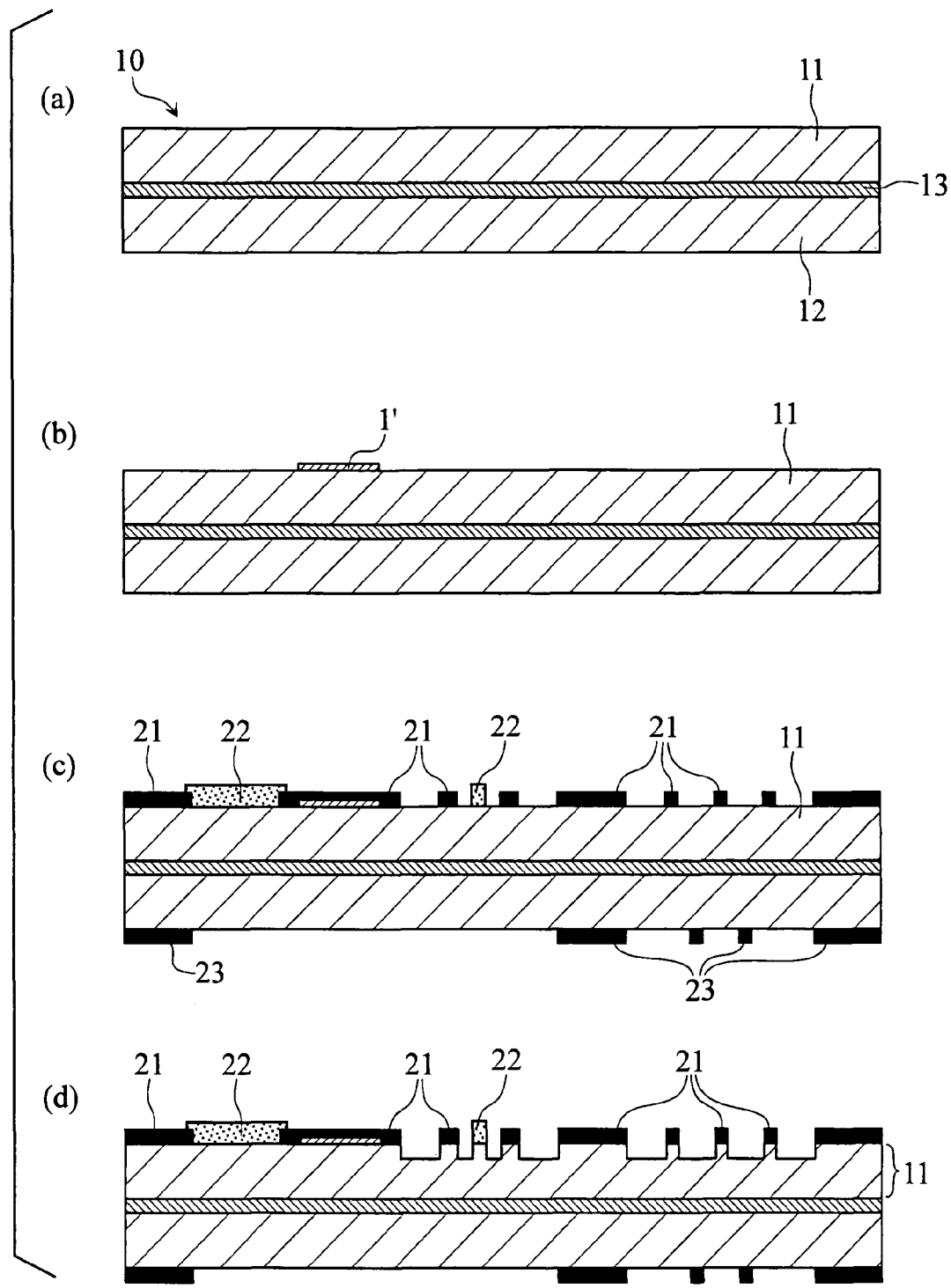
FIG. 9 shows steps of a method of manufacturing the micromirror element in FIG. 1.
Figure 10:
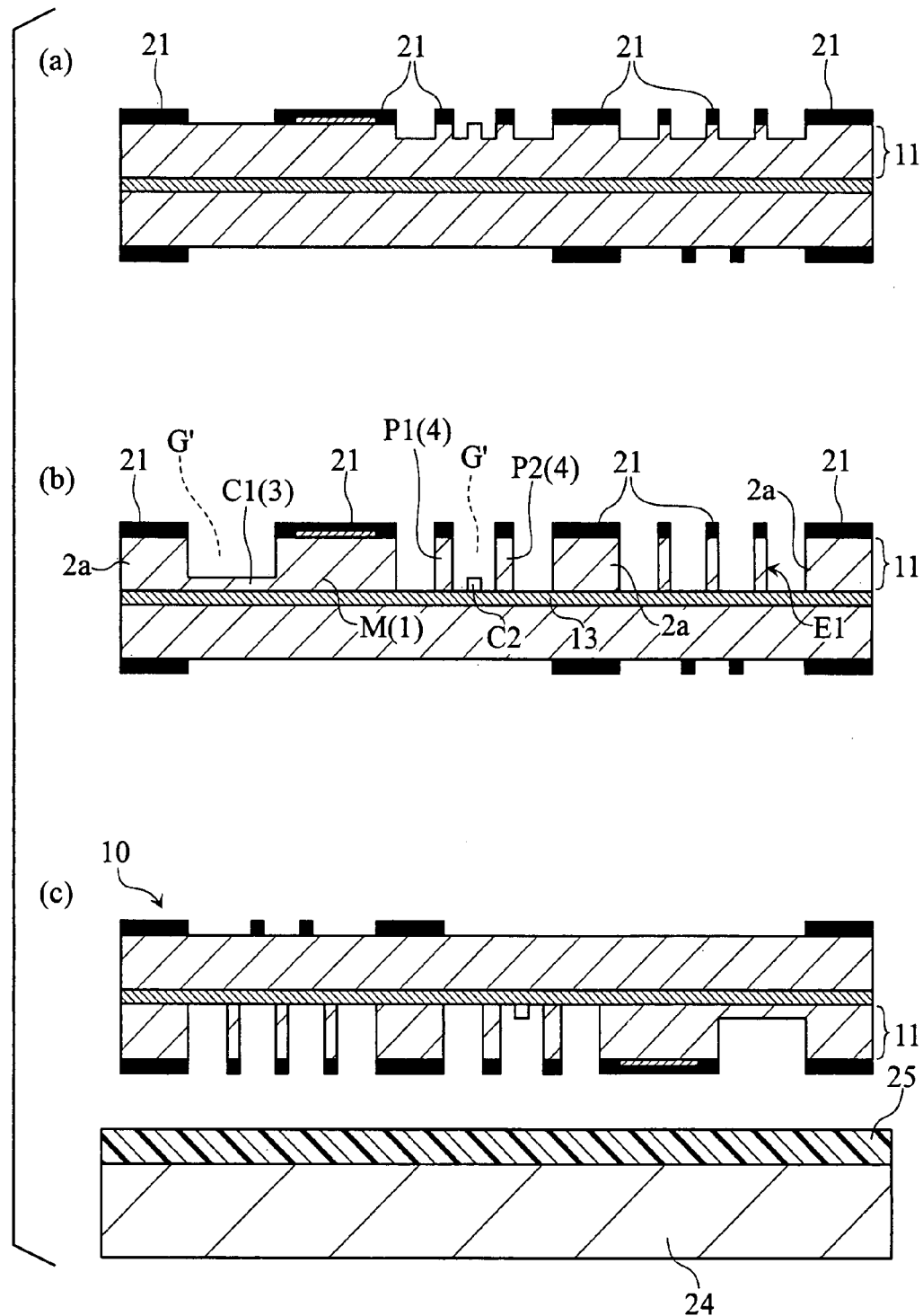
FIG. 10 shows steps continued from FIG. 9.
Figure 11:
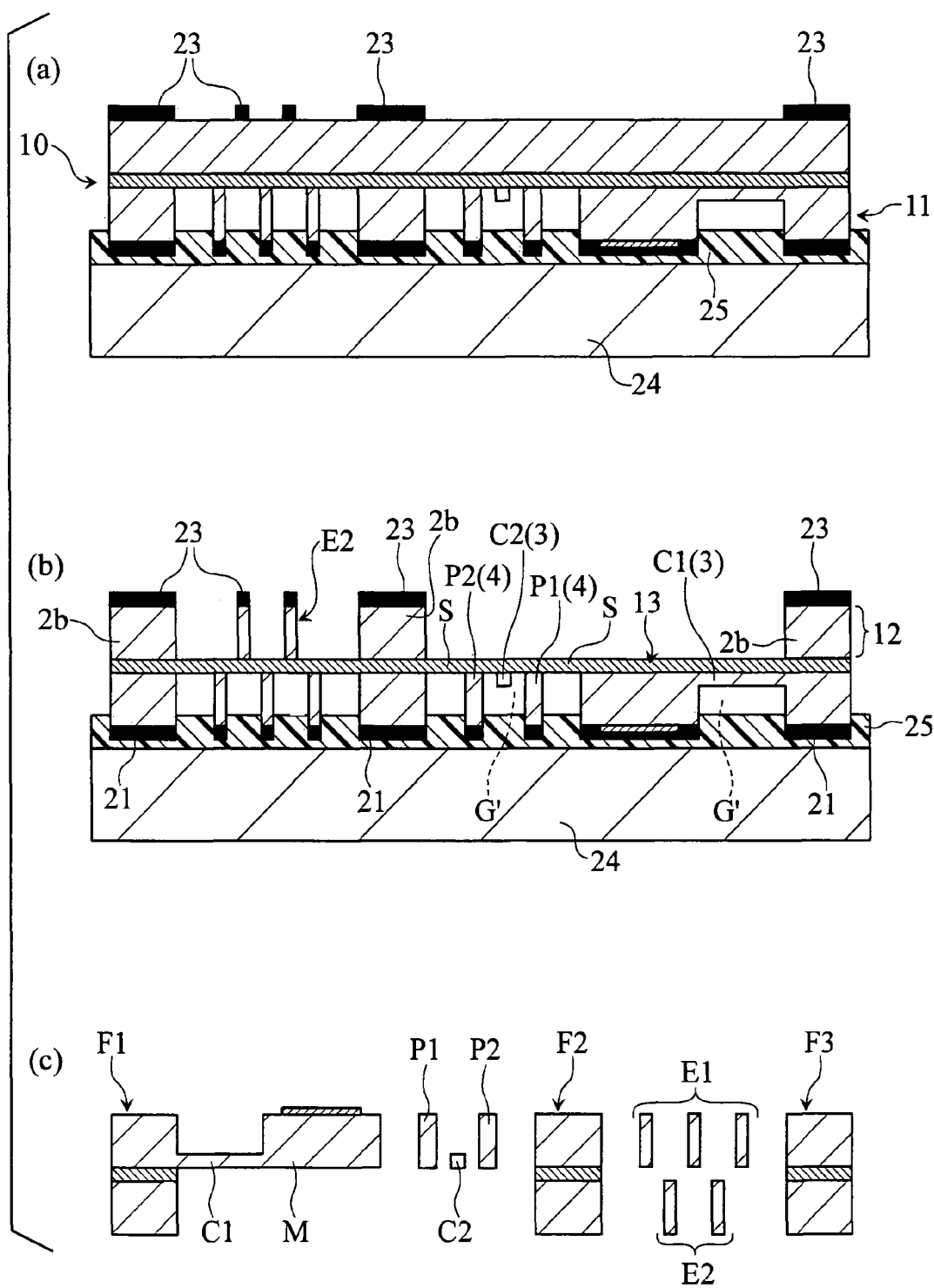
FIG. 11 shows steps continued from FIG. 10.

FIG. 9 through FIG. 11 show a method of making the micromirror element X1. The method is an example of how the micromirror element X1 can be manufactured through micromachining technology. FIG. 9 through FIG. 11 show a section in a series, illustrating a formation process of various parts shown in FIG. 11(c), i.e. a moving part M, frames F1, F2, F3, connecting parts C1, C2, protective parts P1, P2, and a set of comb-teeth electrodes E1, E2. The section featured in the figures is a conceptual composite collected from a plurality of fragmentary sections of a material wafer to which a series of manufacturing operations are made to form a single micromirror element. The moving part M represents a portion of the moving part 1. The frames F1, F2, F3, each representing the frame 2, are cross-sections of selected portions in the frame 2. The connecting parts C1, representing the connecting part 3, is a section taken in the direction in which the connecting part 3 extends. The connecting parts C2, representing the connecting part 3, is a cross-section of the connecting part 3. The protective parts P1, P2, each representing the protective part 4, are cross-sections of the protective part 4. The comb-teeth electrode E1, representing the comb-teeth electrodes 5, 6, is a partial cross-section of the comb-teeth electrodes 5, 6. The comb-teeth electrodes E2, representing the comb-teeth electrodes 7, 8, is a partial cross-section of the comb-teeth electrodes 7, 8.

In the manufacture of the micromirror element X1, first, a material substrate 10 as shown in FIG. 9(a) is prepared. The material substrate 10 is an SOI (Silicon on Insulator) wafer which has a laminated structure including silicon layers 11, 12, and an insulation layer 13 between the silicon layers 11, 12. The insulation layers 11, 12 are made of an electrically conductive silicon material doped with impurity. The impurity may be a p-type impurity such as boron, or an n-type impurity such as phosphorus and antimony. The insulation layer 13 is made of oxide silicon for example. The silicon layer 11 has a thickness of e.g. 5 through 100 μm, the silicon layer 12 has a thickness of e.g. 100 through 500 μm, and the insulation layer 13 has a thickness of e.g. 0.2 through 2 μm. The silicon layers 11, 12 and the insulation layer 13 are the first and the second process layers and the middle layer according to the present invention.

Next, as shown in FIG. 9(b), a mirror surface 1' is formed on the silicon layer 11. Specifically, first, a film of Cr (50 nm) for example, and then a film of Au (200 nm) for example are formed by spattering on the silicon layer 11. Next, these metal films are etched sequentially via a predetermined mask. Through the procedure, the mirror surface 1' is patterned on the silicon layer 11. The etchant for Au may be aqueous potassium iodide-iodine solution. The etchant for Cr may be aqueous cerium ammonium nitrate solution.

Next, as shown in FIG. 9(c), an oxide film pattern 21 and a resist pattern 22 are formed on the silicon layer 11, and an oxide film pattern 23 is formed on the silicon layer 12. The oxide film pattern 21 has a pattern for forming the moving part M, the frames F1, F2, F3, the protective parts P1, P2 and the comb-teeth electrode E1. The resist pattern 22 has a pattern for forming the connecting parts C1, C2. The oxide film pattern 23 has a pattern for forming the frames F1, F2, F3 and the comb-teeth electrode E2.

The oxide film pattern 21 may be formed as follows: First, a film of silicon dioxide is formed by e.g. CVD method on the silicon layer 11, to a thickness of e.g. 1 μm. Next, the oxide film on the silicon layer 11 is patterned by etching via a mask of a predetermined resist pattern. It should be noted here that the oxide film pattern 23 and other oxide film patterns to be described later may also be formed in the same procedure including film formation of resist pattern formation on the oxide film using an oxide material, and etching thereafter. On the other hand, the resist pattern 22 is formed by first forming a film of photoresist on the silicon layer 11 through spin coating of a liquid photoresist, and then exposing, developing and patterning the photoresist film. Examples of the photoresist include AZP4210 (manufactured by AZ Electronic Materials) and AZ1500 (manufactured by AZ Electronic Materials). Other resist patterns to be described later can also be formed through essentially the same processes of photoresist film formation followed by exposure and development.

As shown in FIG. 9(d), the next step in the manufacture of the micromirror element X1 is anisotropic dry etching by DRIE (Deep Reactive Ion Etching) to the silicon layer 11 to a predetermined depth, with masks provided by the oxide film pattern 21 and the resist pattern 22. The predetermined depth is a depth equal to the thickness of the connecting parts C1, C2, being 5 μm for example. This step uses a predetermined etching apparatus equipped with a vacuum chamber to perform the DRIE in the vacuum chamber under predetermined vacuum conditions. Good anisotropic etching can be performed in the DRIE if a Bosch process is employed in which etching and side-wall protection are alternated with each other. The DRIE in this step and those described later may be performed by using the Bosch process.

Next, as shown in FIG. 10(a), the resist pattern 22 is removed with a remover such as AZ Remover 700 (manufactured by AZ Electronic Materials). This remover may also be used to remove resist patterns to be described later.

Next, as shown in FIG. 10(b), using the oxide film pattern 21 as a mask, anisotropic etching by DRIE is performed to the silicon layer 11 until the insulation layer 13 is reached while leaving the thin connecting parts C1, C2 which contact the insulation layer 13. In this step again, a predetermined etching apparatus equipped with a vacuum chamber is used as in the previous step described with reference to FIG. 9(d), and the dry etching operation is performed in the vacuum chamber under predetermined vacuum conditions. This step yields the connecting parts C1, C2, as well as the moving part M, part of the frames F1, F2, F3 (the first layer 2a), the protective parts P1, P2, and the comb-teeth electrode E1.

The moving part 1 and the first layer 2a of the frame 2 formed in the present step oppose to each other, across a separation gap G' to which the insulation layer 13 exposes partially. Each of the connecting parts 3 is in contact with the insulation layer 13, and connects the moving part 1 and the first layer 2a across the separation gap G'. Each of the protective parts 4 is in contact with the insulation layer 13, and extends from the moving part 1 or from the first layer 2a into the separation gap G'.

Next, as shown in FIG. 10(c) and FIG. 11(a), a sub-carrier 24 is bonded to the silicon layer 1 side of the material substrate 10 via a bonding member 25. The sub-carrier 24 is provided by a silicon substrate, a quartz substrate or a metal substrate for example. The bonding member 25 is provided by resist, thermoconductive grease, sealant or a tape. An example of the resist is Resist AZP4210 (manufactured by AZ Electronic Materials). In this step, the material substrate 10 and the sub-carrier 24 are bonded to each other under heat and pressure. A purpose of bonding the sub-carrier 24 in such a way is to prevent damage to the material substrate 10 and to the etching apparatus in the next manufacturing step. In the next manufacturing step, etching is performed to the silicon layer 12 in the vacuum chamber of the etching apparatus. In this process, mechanical strength of the material substrate 10 decreases substantially because of the etching performed to the silicon layer 12, with the silicon layer 11 having already been etched. The sub-carrier 24 serves as a reinforcing member for the material substrate 10, and prevents the material substrate 10 from breaking. If the material substrate 10 breaks in the vacuum chamber, broken pieces can damage the etching apparatus. Therefore, damage prevention of the material substrate 10 by the sub-carrier 24 also contributes to damage prevention of the apparatus.

Next, as shown in FIG. 11(b), using the oxide film pattern 22 as a mask, anisotropic etching by DRIE is performed to the silicon layer 12 until the insulation layer 13 is reached. In this step again, a predetermined etching apparatus equipped with a vacuum chamber is used as in the previous step described with reference to FIG. 9(d), and the dry etching operation is performed in the vacuum chamber under predetermined vacuum conditions. This step yields part of the frames F1, F2, F3 (the second layer 2b) and the comb-teeth electrode E2. Also, the present step exposes the insulation layer 13 partially in the silicon layer 12. The exposed portion includes the portions S (double-side exposed portion) which expose also to the separation gap G' on the silicon layer 11 side, portions contacted by the connecting parts C1, C2 (each of the connecting parts 3), and portions contacted by the protective parts P1, P2 (each of the protective parts 4).

After this step, the material substrate 10 and the sub-carrier 24 are separated from each other. If the bonding member 25 is provided by resist, a predetermined remover may be applied to the bonding member 25 to separate the material substrate 10 from the sub-carrier 24.

Next, as shown in FIG. 11(c), exposed areas of the insulation layer 13 and the oxide film patterns 21, 23 are etched off. The etching may be dry etching or wet etching. If dry etching is used, examples of usable etching gas include CF4 and CHF3. If wet etching is used; the etchant used in this process may be buffered hydrofluoric acid (BHF) which contains hydrofluoric acid and ammonium fluoride.

By performing the above-described sequence of steps, it is possible to form a moving part M, frames F1, F2, F3, connecting parts C1, C2, protective parts P1, P2, and a set of comb-teeth electrodes E1, E2, and thereby to manufacture a micromirror element X1. The process described with reference to FIG. 9(c) through FIG. 10(b), i.e. a series of micromachining operations performed to the silicon layer 11 represent the first processing step according to the present invention. The process described with reference to FIG. 9(c) and FIG. 11(b), i.e. micromachining operations performed to the silicon layer 12 represent the second processing step according to the present invention.

Figure 12:
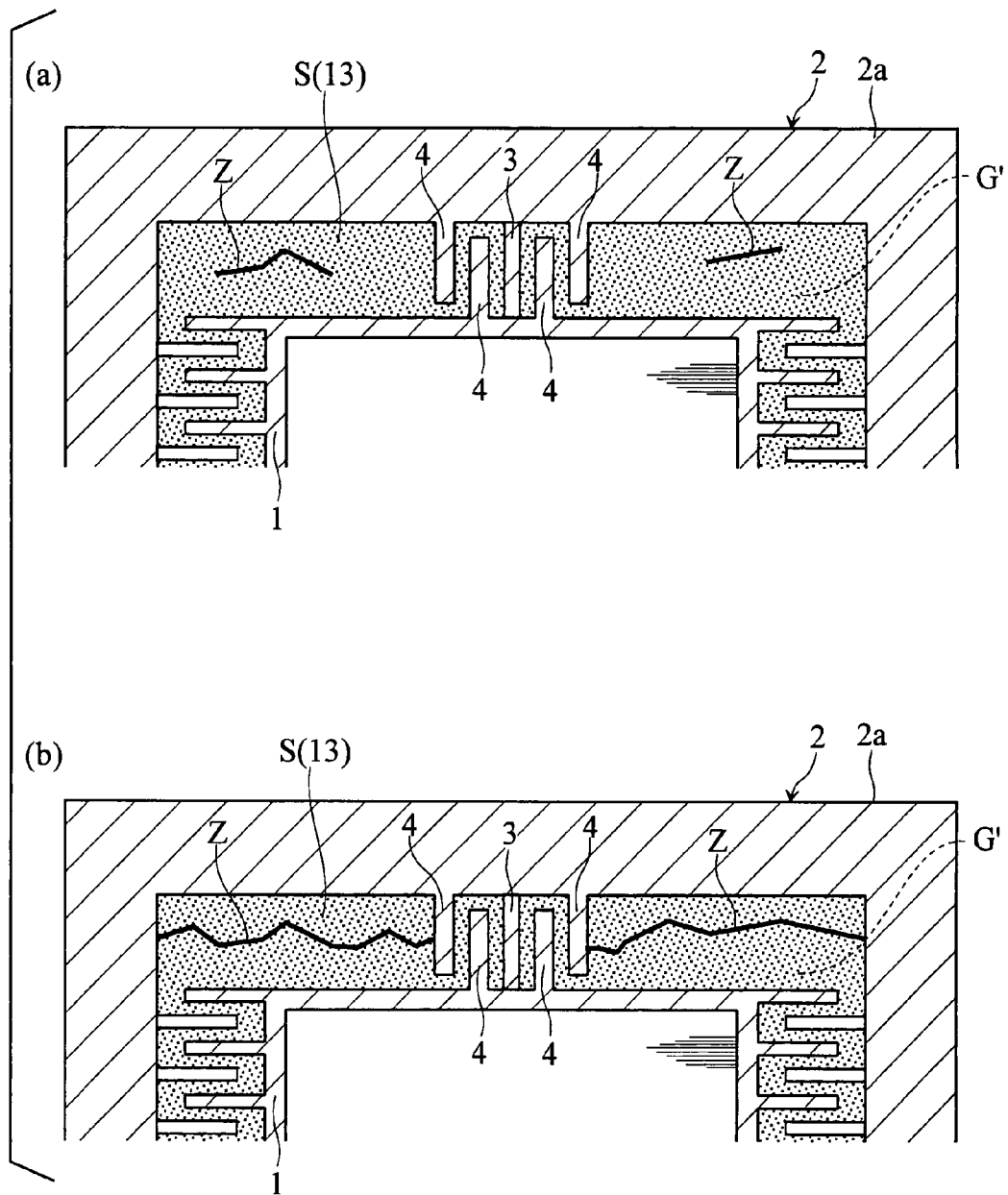
FIG. 12 illustrates a function of a protective part according to the present invention.

In the first processing step according to the present method, protective parts 4 which make contact with the insulation layer 13 and extend from the moving part 1 or from the first layer 2a into the separation gap G1 are formed out of the silicon layer 11, along with the connecting parts 3 which are in contact with the insulation layer 13 and provide connection between the moving part 1 and the first layer 2a of the frame 2 across the separation gap G'. As a result, breakage of the connecting parts 3 which contact the insulation layer 13 is reduced under circumstances resulted from the second processing step performed to the portions S (double-side exposed portion) in the insulation layer 13. If a local fracture Z occurs as shown in FIG. 12(a), in the portion S of the insulation layer 13, the protective parts 4 which is in contact with the insulation layer 13 prevents the fracture Z from reaching the connecting part 3 as shown in FIG. 12(b).

As a fracture Z runs across an area of the insulation layer 13 contacted by a protective part 4 extended into the separation gap G', an impact from the fracture reaches the protective part 4, and the protective part 4 absorbs at least part of the energy necessary for the fracture Z to grow further. With the presence of these protective parts 4 which can provide the above-described function, breakage probability of the connecting part 3 which is in contact with the insulation layer 13 and bridges across the separation gap G' is decreased. The breakage probability of the connecting part tends to decrease if the protective part 4 is closer to the connecting part. Also, the breakage probability of the connecting part tends to decrease with increase in the number of protective parts 4 provided.

As described, the present method decreases breakage probability of the connecting part 3, and therefore, the present method is suitable for manufacturing micromirror elements (microstructure devices) which include connecting parts 3 that connect a moving part (the first structural part) and the frame (the second structural part).

Figure 13:
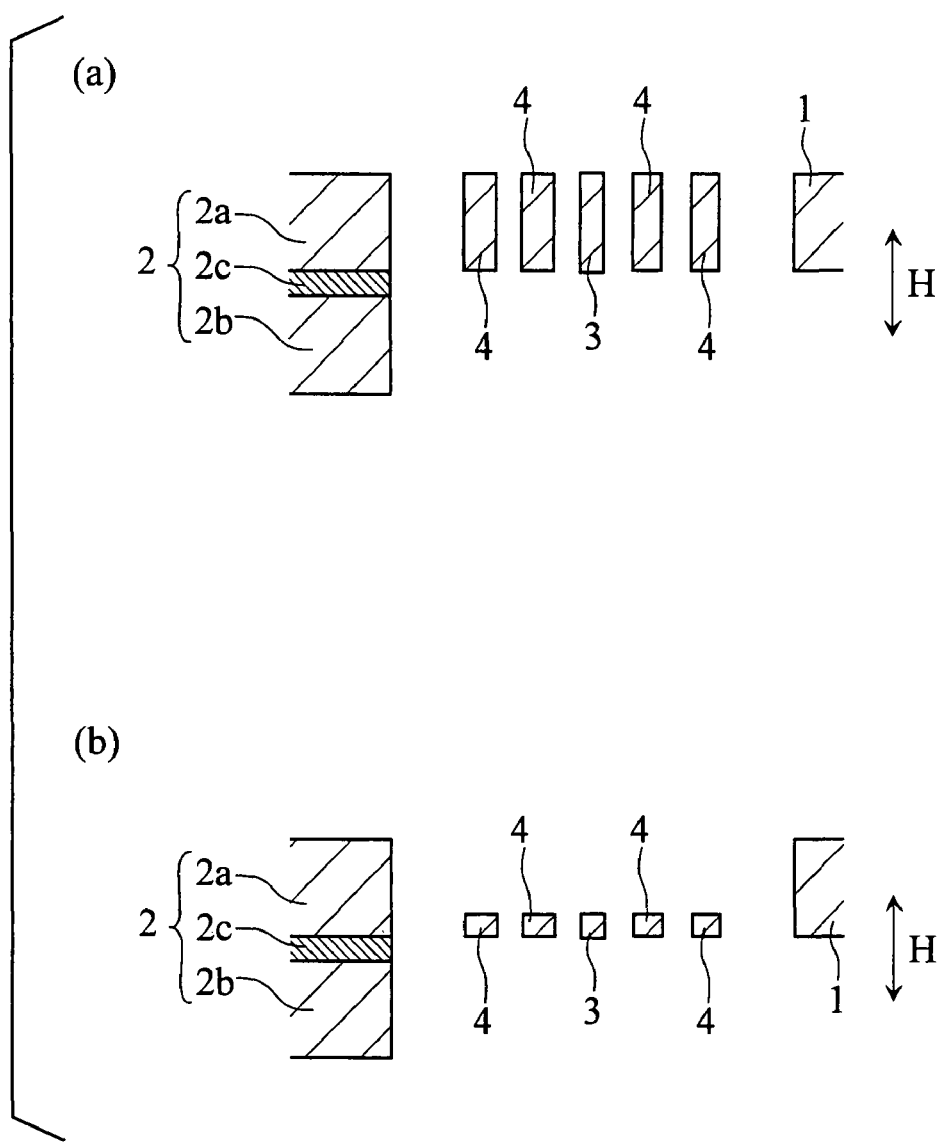
FIG. 13(a) and FIG. 13(b) are enlarged partial sectional view of a variation of the micromirror element in FIG. 1, corresponding to FIG. 8.

As shown in FIG. 13(a), in the micromirror element X1, the connecting parts 3 may have the same thickness as the moving part 1, the first layer 2a of the frame 2 and the protective parts 4, in the thickness direction H of the element. Thick connecting parts 3 such as these can be formed in the same way as the thick protective parts 4.

As shown in FIG. 13(b), the protective parts 4 may have the same thickness as the thin connecting parts 3, in the thickness direction H of the element. Thin protective parts 4 such as these can be formed in the same way as the thin connecting parts 3.

Figure 14:
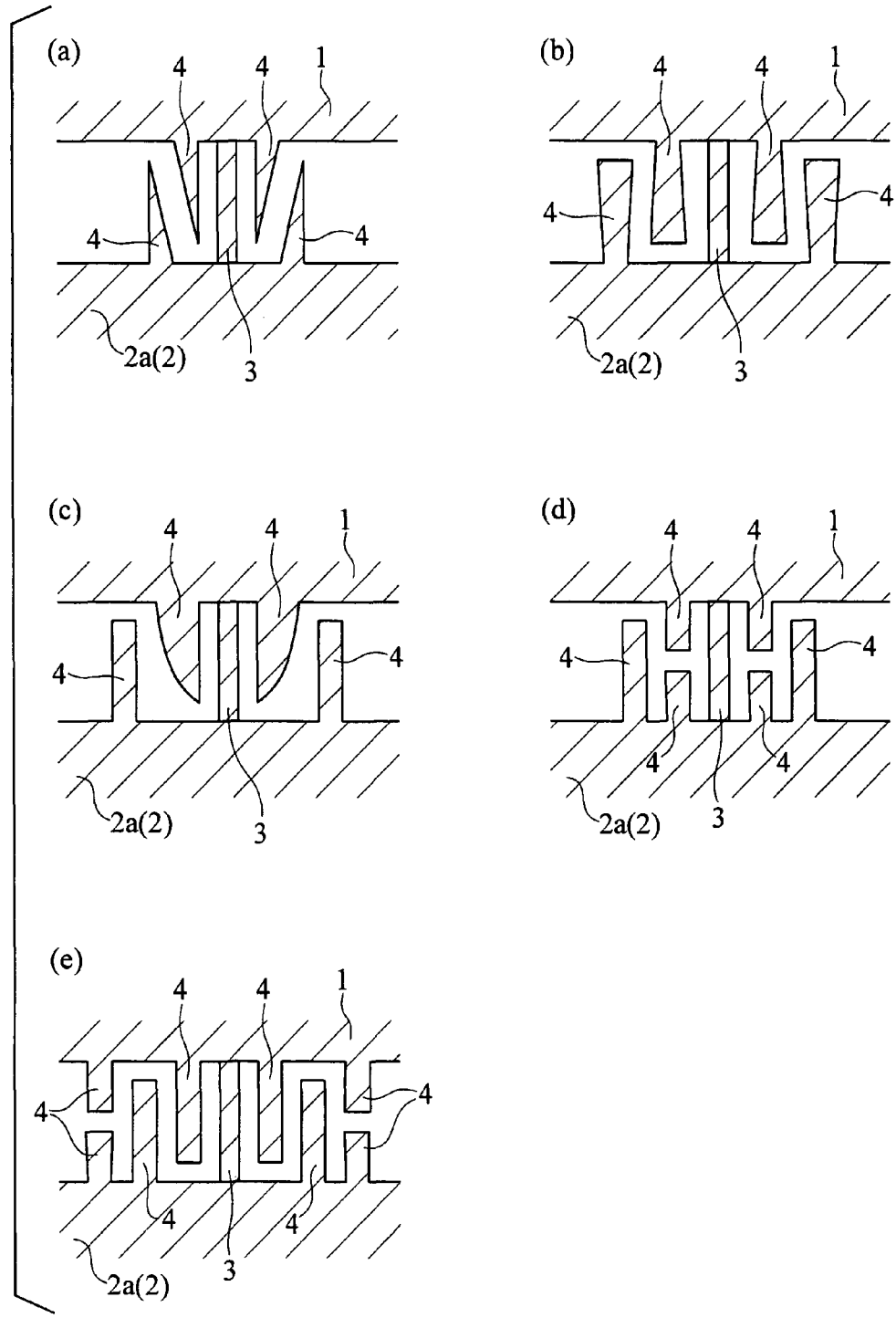
FIG. 14(a) through FIG. 14(e) are enlarged partial sectional views each showing a variation of the micromirror element in FIG. 1, corresponding to FIG. 7.

The micromirror element X1 may have protective parts 4 shaped as shown in FIG. 14(a). In this variation, each of the protective part 4 extending from the moving part 1 as well as each of the protective parts 4 extending from the frame 2 is narrower toward its tip.

The protective parts 4 may also have a shape shown in FIG. 14(b). In this variation, each of the protective part 4 extending from the moving part 1 as well as each of the protective parts 4 extending from the frame 2 is wider toward its tip.

The protective parts 4 may also have a shape shown in FIG. 14(c). In this variation, each of the protective parts 4 extending from the moving part 1 has a round side 4a.

In the micromirror element X1, four protective parts 4 are provided for each connecting part 3 as shown in FIG. 7: Alternatively, six protective parts 4 may be provided for each connecting part 3 as shown in FIG. 14(d). Similarly, six protective parts as shown in FIG. 14(e) may be 4 provided for each connecting part 3.

Figure 15:
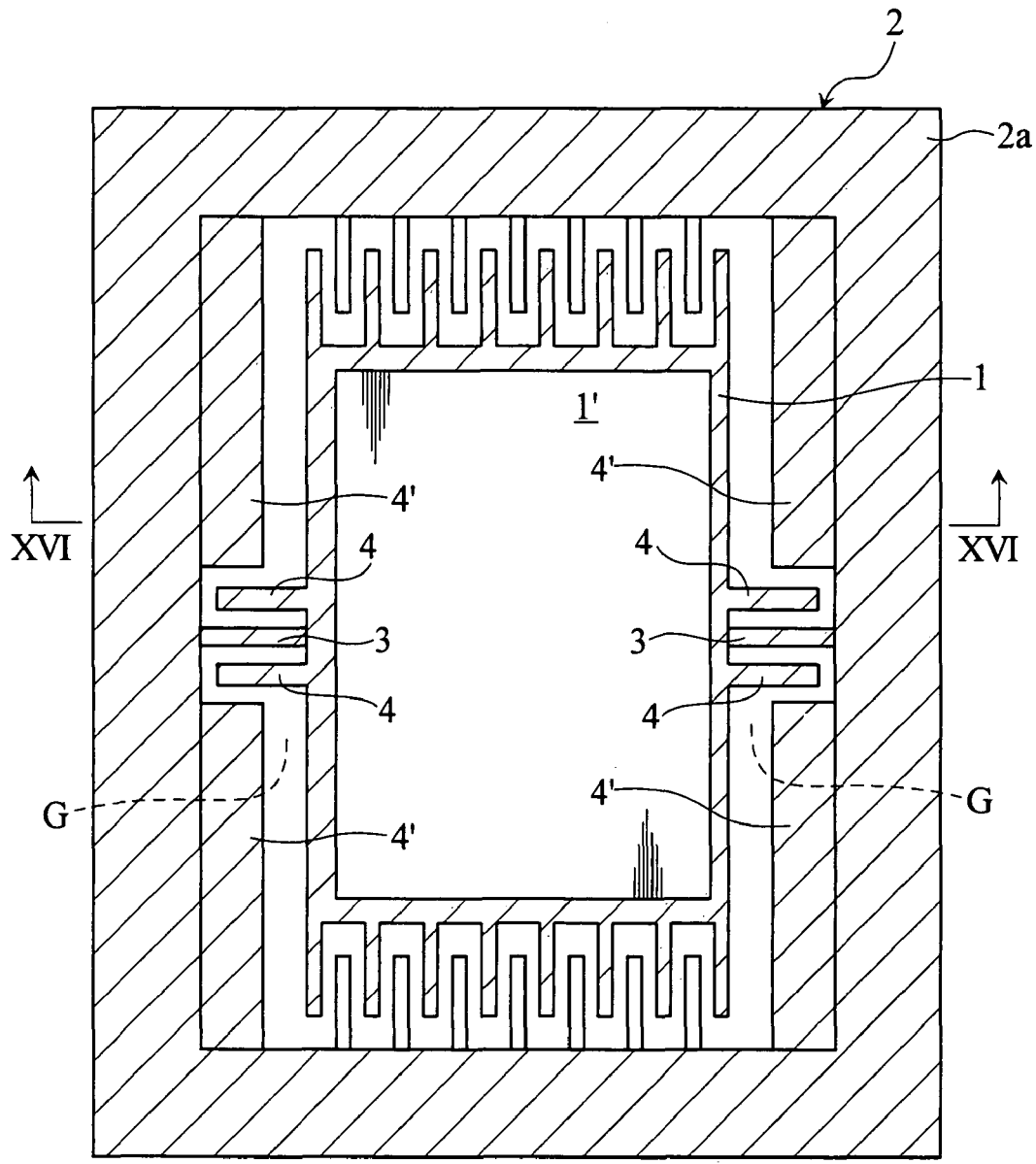
FIG. 15 is a plan view of a variation of the micromirror element in FIG. 1.
Figure 16:
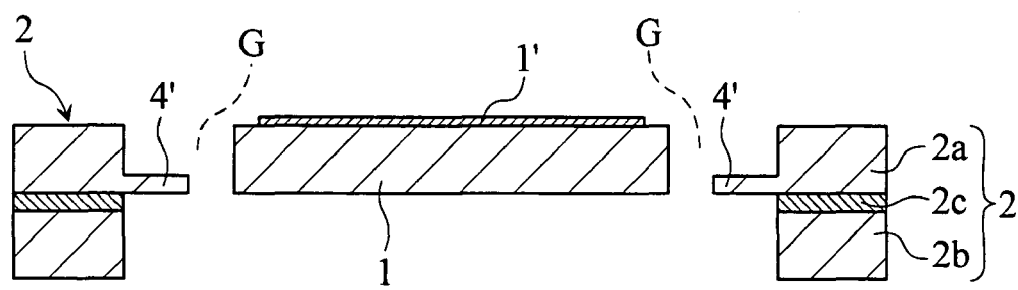
FIG. 16 is a sectional view taken in lines XVI-XVI in FIG. 15.

In the micromirror element X1 some of the protective parts 4 may be replaced by protective parts 4' as shown in FIG. 15 and FIG. 16. The protective parts 4' are thinner than the first layer 2a of the frame 2, and extend from the first layer 2a into the gap G, along the frame 2.

As has been exemplified with the variations described above, the shape, number, layout, etc. of the protective parts 4 may be varied as necessary.

Figure 17:
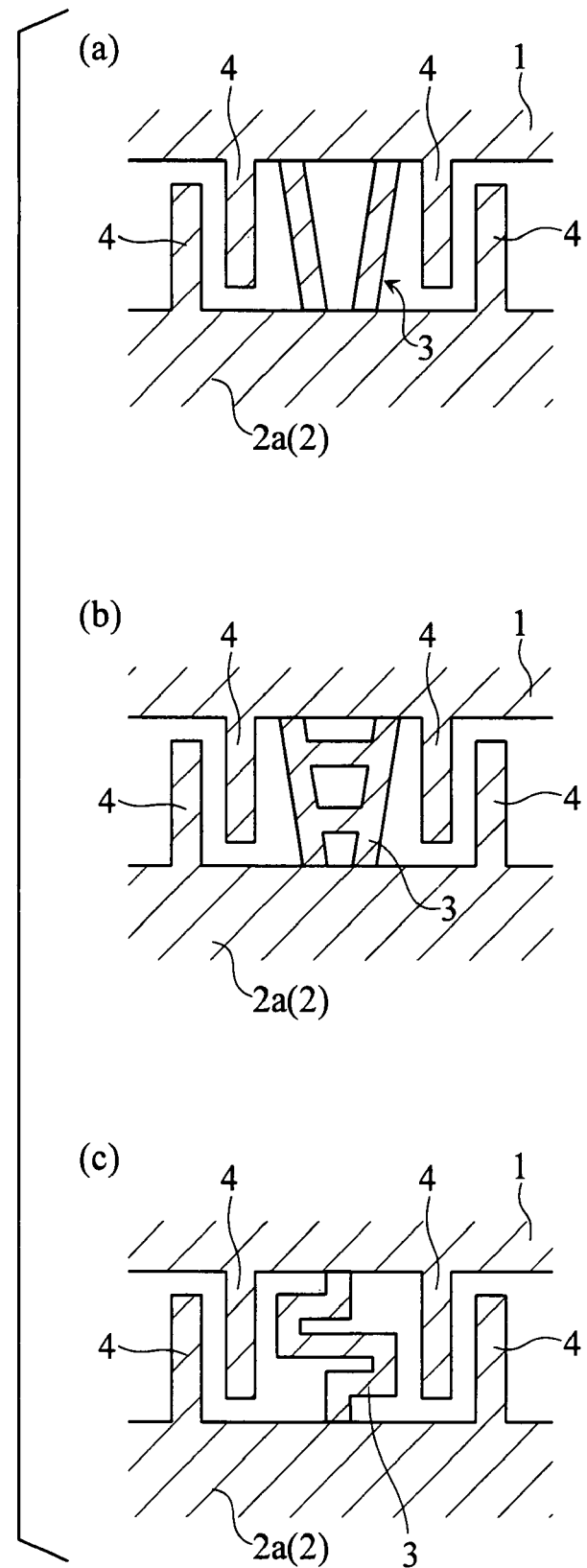
FIG. 17(a) through FIG. 17(c) are enlarged partial sectional views each showing a variation of the micromirror element in FIG. 1 and corresponding to FIG. 7.

In the micromirror element X1, the connecting parts 3 have a shape as shown in FIG. 7: Alternatively, the shape may be as shown in FIG. 17(a). The connecting part 3 in FIG. 17(a) includes two bars spaced from each other with increasing distance from the frame 2 toward the moving part 1. Similarly, the connecting parts 3 may have a shape shown in FIG. 17(b) or in FIG. 17(c). As has been exemplified with these variations, the shape of the connecting parts 3 may be varied as needed.

Figure 18:
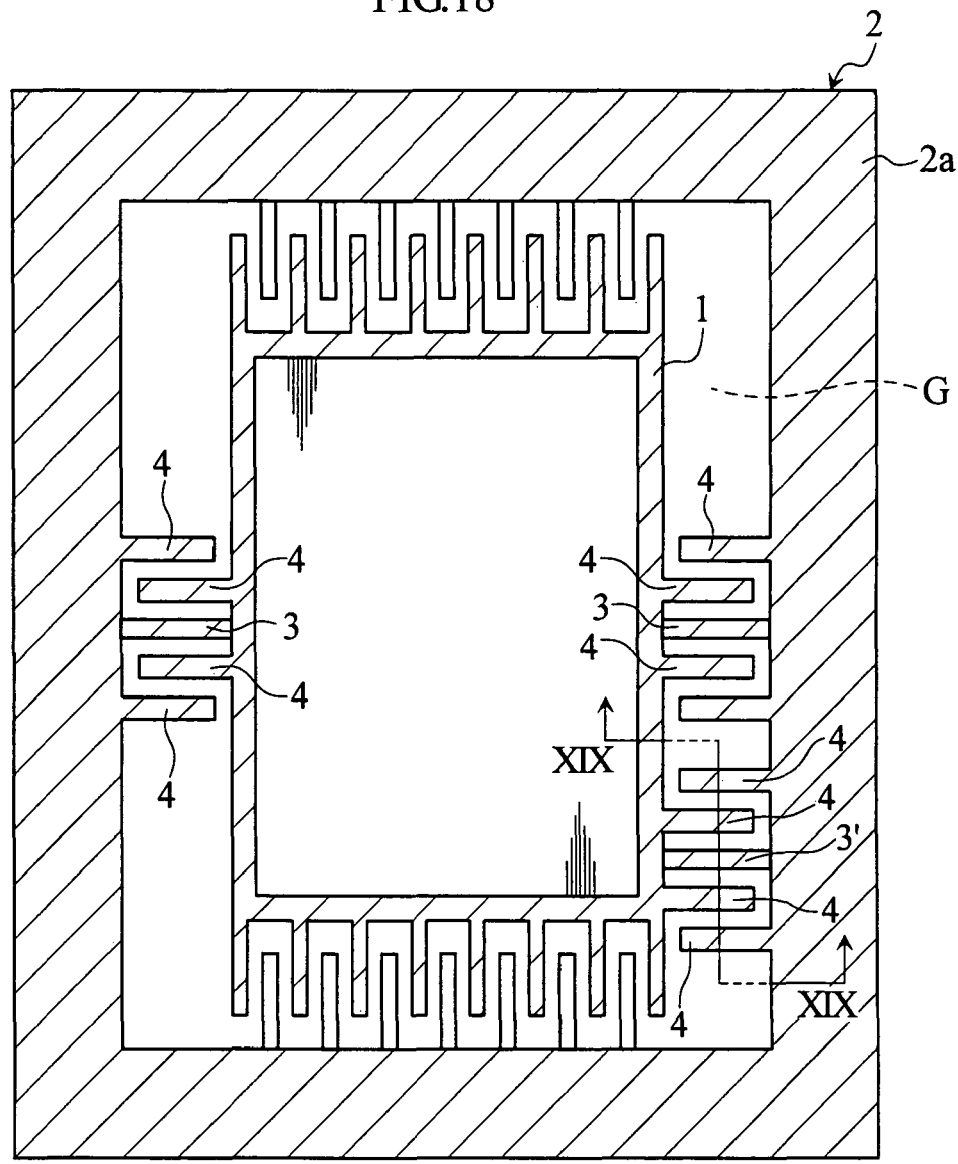
FIG. 18 is a plan view of a variation of the micromirror element in FIG. 1.
Figure 19:
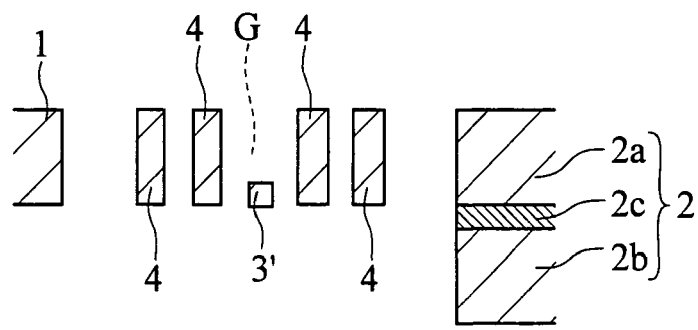
FIG. 19 is an enlarged partial sectional view taken in lines XIX-XIX in FIG. 18.

As shown in FIG. 18 and FIG. 19, the micromirror element X1 may further include a supporting part 3' and a set of protective parts 4 formed closely to the supporting part 3'. The supporting part 3', which reinforces the connection provided by the connecting part 3 between the moving part 1 and the frame 2, is cut or removed before the micromirror element X1 is utilized. The supporting part 3' can be cut or removed by a beam of Nd:YAG laser.

The comb-teeth electrodes 5 through 8 constitute an actuator (drive means): In the present invention, at least one of the comb-teeth electrode pair 5, 7 and the comb-teeth electrode pair 6, 8 may be constituted to serve as detection means for detection of electrostatic capacity change between the comb-teeth electrodes. Such an arrangement enables to obtain information on a relative amount of displacement of the moving part 1 with respect to the frame 2, based on the electrostatic capacity change.

In the present invention, a material substrate may be formed therein, with a row of micromirror elements X1. These micromirror elements X1 arranged in a one-dimensional array as described have all of their pivotal axes A for the moving parts 1 being parallel to each other for example.

In the present invention, a material substrate may be formed therein, with rows of micromirror elements X1. These micromirror elements X1 arranged in a two-dimensional array as described have all of their pivotal axes A for the moving parts 1 being parallel to each other for example.

In the present invention, the micromirror element X1 may further include an outer frame which surrounds the frame 2, and a pair of connecting parts which connect the outer frame and the frame 2. This additional pair of connecting parts preferably provides a pivotal axis for pivotal displacement or pivotal movement of the frame 2 with respect to the outer frame as well as of associated movement of the moving part 1. Preferably, this pivotal axis is perpendicular to the pivotal axis A.

A microstructure device according to the present invention may be the micromirror element X1 which does not include one of the connecting parts 3. In such a microstructure device, the moving part 1 which is connected with the frame 2 by only one connecting part 3 can swing in any directions across the direction along which the connecting part 3 extends.

Figure 20:
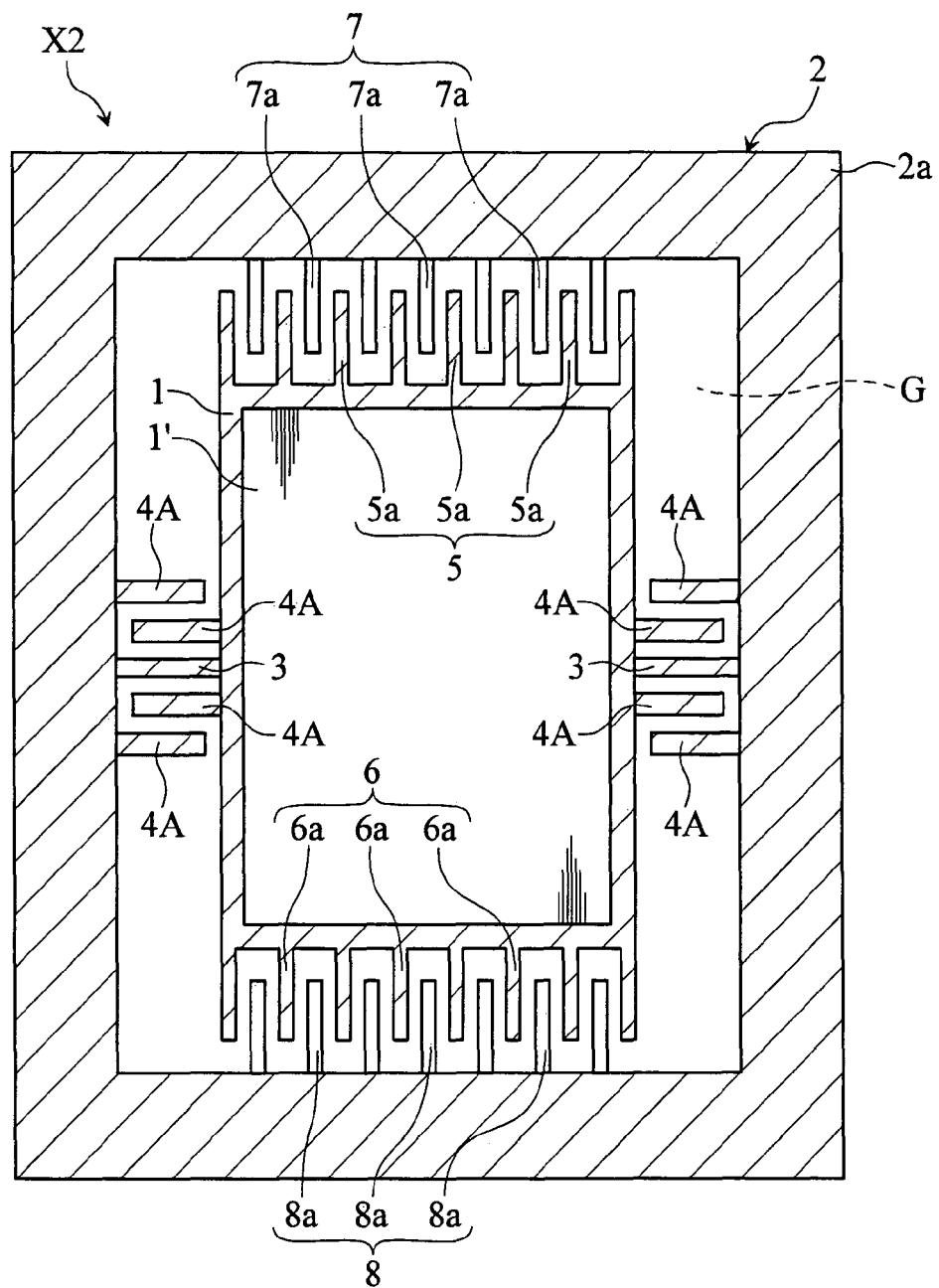
FIG. 20 is a plan view of a micromirror element according to a second embodiment of the present invention.
Figure 21:
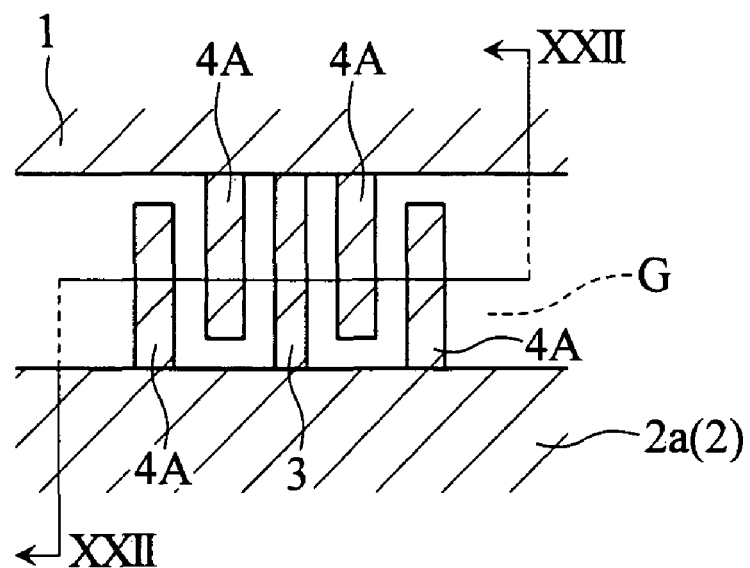
FIG. 21 is an enlarged partial plan view of the micromirror element in FIG. 20.
Figure 22:
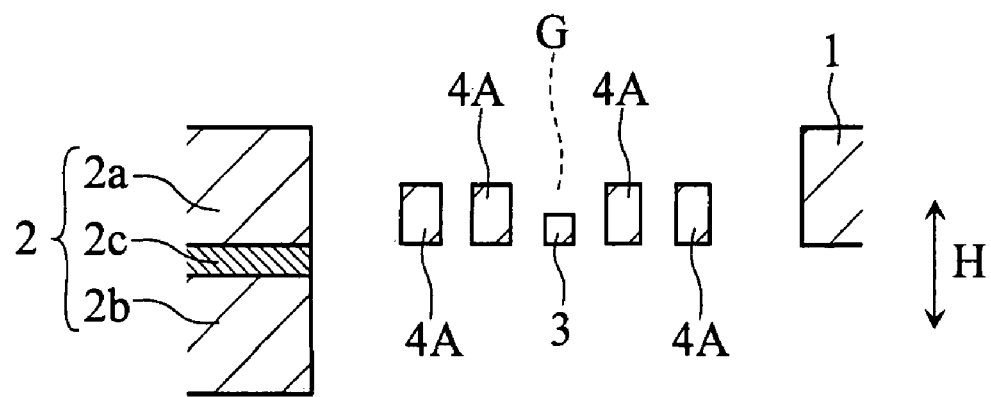
FIG. 22 is a sectional view taken in lines XXII-XXII in FIG. 21.

FIG. 20 is a plan view of a micromirror element X2 according to a second embodiment of the present invention. FIG. 21 is an enlarged partial view of the micromirror element X2. FIG. 22 is a sectional view taken in lines XXII-XXII in FIG. 21.

The micromirror element X2 includes a moving part 1, a frame 2, a pair of connecting parts 3, a plurality of protective parts 4A, and comb-teeth electrodes 5, 6, 7, 8. The micromirror element X2 differs from the micromirror element X1 only in that it has protective parts 4A instead of the protective parts 4, and thus can be driven in the same way as the micromirror element X1.

Each of the protective parts 4A is a portion derived from the first silicon layer, and extends from the moving part 1 or the first layer 2a of the frame 2, into the gap G. Closely to each connecting part 3, two protective parts 4A extend from the moving part 1, and two protective parts 4A extend from the first layer 2a. As shown in FIG. 22, all of the protective parts 4A are thinner than the moving part 1 and the first layer 2a of the frame 2 in the thickness direction H of the element.

Figure 23:
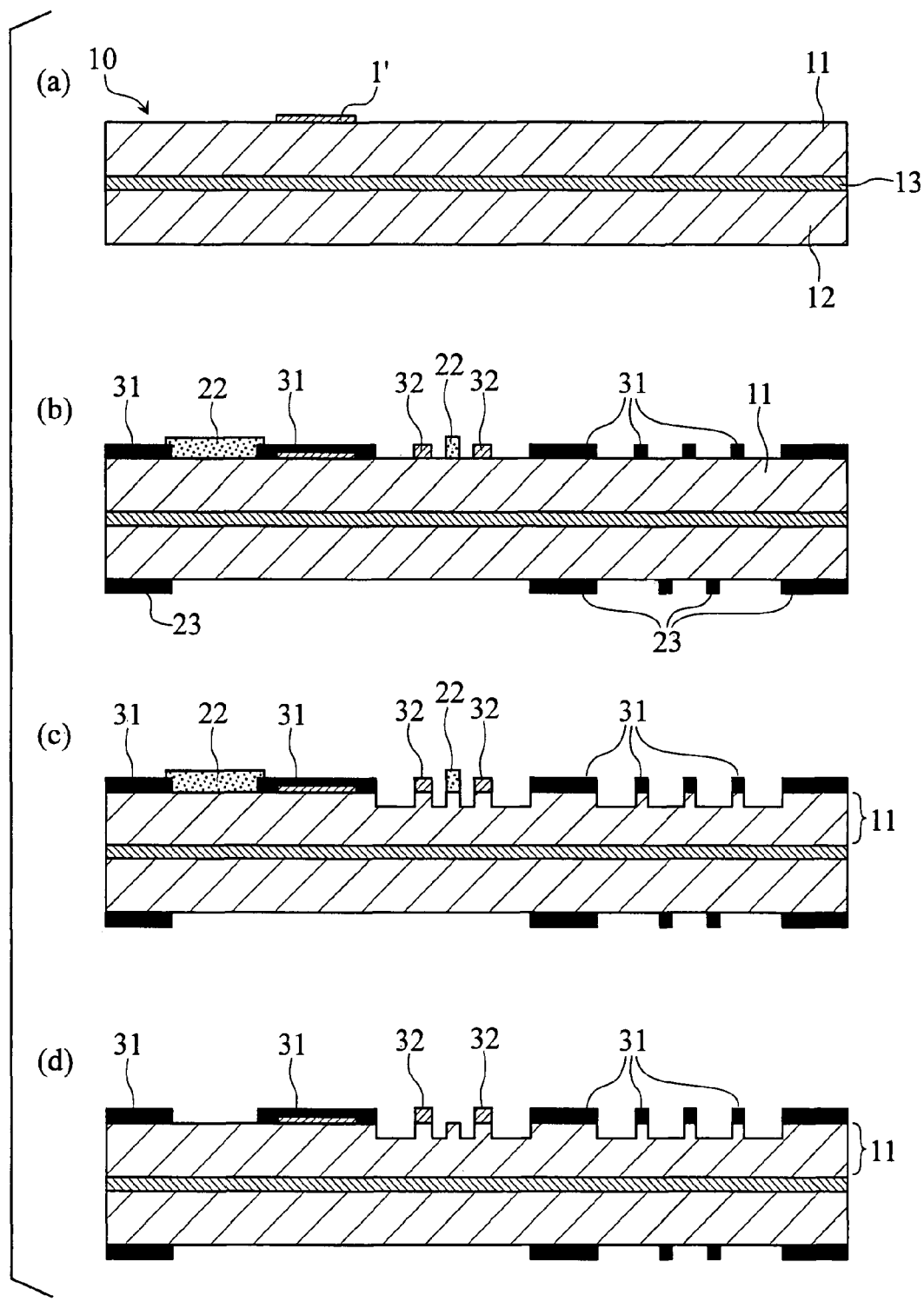
FIG. 23 shows steps in a method of manufacturing the micromirror element in FIG. 20.
Figure 24:
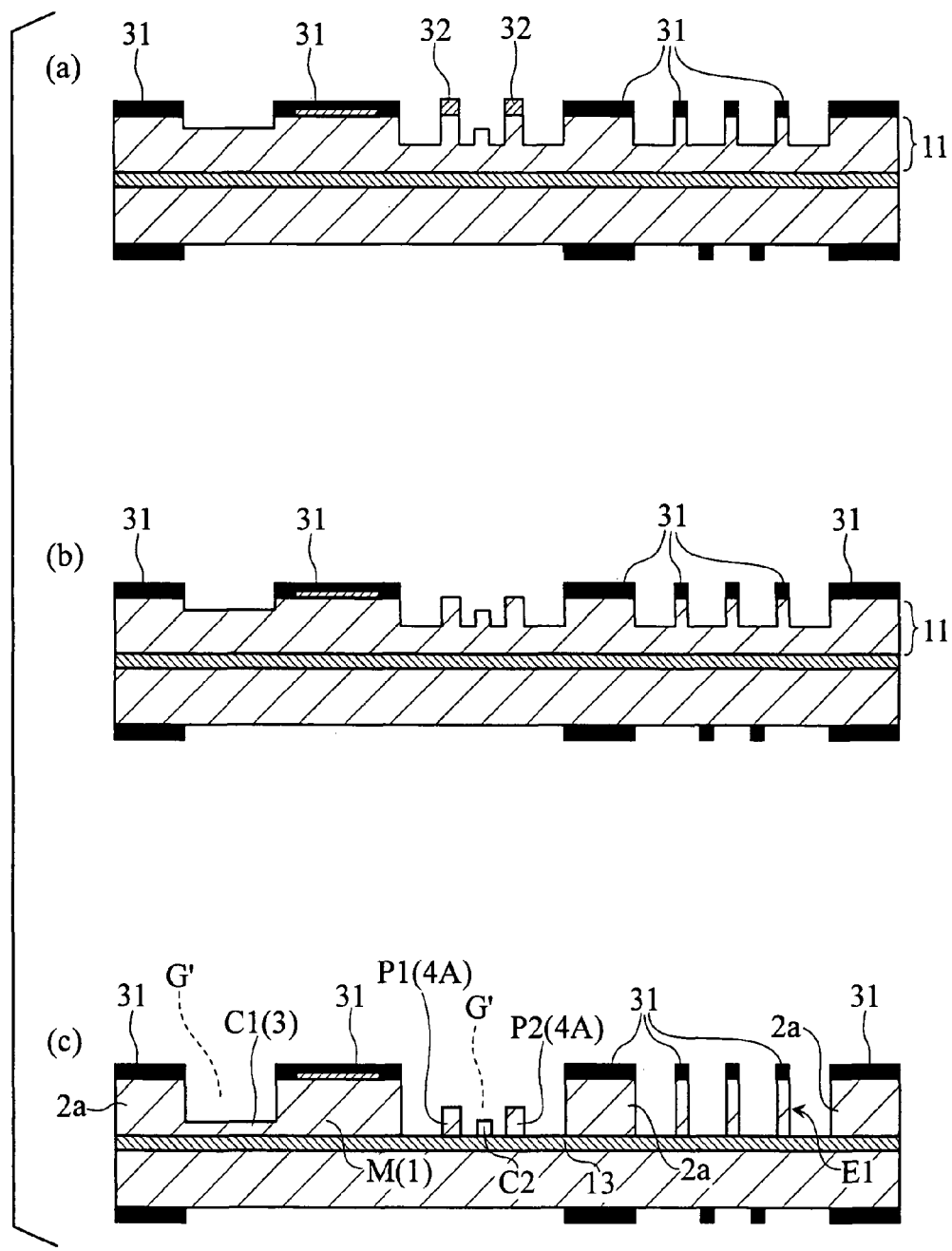
FIG. 24 shows steps continued from FIG. 23.
Figure 25:
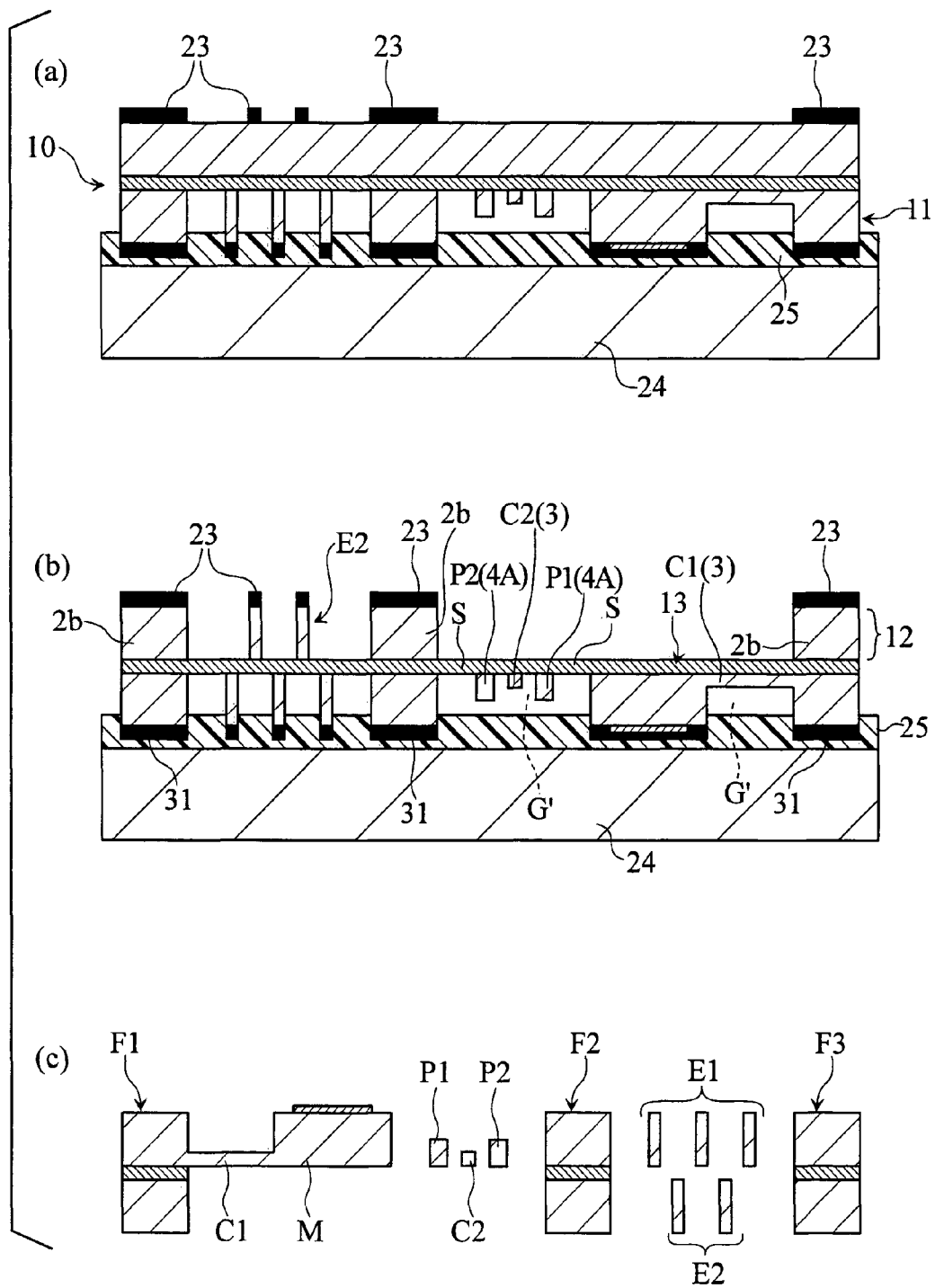
FIG. 25 shows steps continued from FIG. 24.

FIG. 23 through FIG. 25 show a method of making the micromirror element X2. The method is an example of how the micromirror element X2 can be manufactured through micromachining technology. FIG. 23 through FIG. 25 show a section in a series, illustrating a formation process of various parts shown in FIG. 25(c), i.e. a moving part M, frames F1, F2, F3, connecting parts C1, C2, protective parts P1, P2, and a set of comb-teeth electrodes E1, E2. The section featured in the figures is a conceptual composite collected from a plurality of fragmentary sections of a material wafer to which a series of manufacturing operations are made to form a single micromirror element. The protective parts P1, P2, each representing the protective part 4A, are cross-sections of the protective part 4A. The moving part M, the frames F1, F2, F3, the connecting parts C1, C2 and the comb-teeth electrodes E1, E2 are formed in the same way as described for the micromirror element X1.

In the manufacture of the micromirror element X2, first, a mirror surface 1' is formed on a material substrate 10 as shown in FIG. 23(a). The material substrate 10 is the same as in the first embodiment, having a laminated structure provided by silicon layers 11, 12 and an insulation layer 13.

Next, as shown in FIG. 23(b), an oxide film pattern 31, a resist pattern 22 and a nitride film pattern 32 are formed on the silicon layer 11, and an oxide film pattern 23 is formed on the silicon layer 12. The oxide film pattern 31 has a pattern for forming the moving part M, the frames F1, F2, F3, and the comb-teeth electrode E1. The resist pattern 22 has a pattern for forming the connecting parts C1, C2 as described earlier in relation to the method of manufacturing the micromirror element X1. The nitride film pattern 32 has a pattern for forming the protective parts P1, P2. The oxide film pattern 23 has a pattern for forming the frames F1, F2, F3 and the comb-teeth electrode E2 as described earlier in relation to the method of manufacturing the micromirror element X1. When forming the nitride film pattern 32, first, a film of silicon nitride is formed by CVD for example, on the silicon layer 11 to a thickness of e.g. 500 nm. Next, the nitride film on the silicon layer 11 is patterned by etching with a mask of predetermined resist pattern. The patterning may be made by dry etching, using $CF_4$ as etching gas.

Next, as shown in FIG. 23(c), anisotropic dry etching by DRIE is performed to the silicon layer 11 to a predetermined depth, with masks provided by the oxide film pattern 31, the resist pattern 22 and the nitride film pattern 32. The predetermined depth is a depth equal to the thickness of the connecting parts C1, C2, being 5 μm for example. Thereafter, as shown in FIG. 21(d), the resist pattern 22 is removed by remover.

Next, as shown in FIG. 24(a), anisotropic dry etching by DRIE is performed to the silicon layer 11 to a predetermined depth, with masks provided by the oxide film pattern 31 and the nitride film pattern 32. The predetermined depth is a depth equal to a difference between the thickness of protective parts P1, P2 and the thickness of connecting parts C1, C2, being 5 through 50 μm for example. Thereafter, as shown in FIG. 24(b), the nitride film pattern 32 is removed. The nitride film pattern 32 can be removed by etching with hot phosphoric acid.

Next, as shown in FIG. 24(c), using the oxide film pattern 31 as a mask, anisotropic etching by DRIE is performed to the silicon layer 11 until the insulation layer 13 is reached while leaving the connecting parts C1, C2 which contact the insulation layer 13 as well as leaving the protective parts P1, P2. In this step, a predetermined etching apparatus equipped with a vacuum chamber is used, and the dry etching operation is performed in the vacuum chamber under predetermined vacuum conditions. This step yields the connecting parts C1, C2, the protective parts P1, P2, as well as the moving part M, part of the frames F1, F2, F3 (the first layer 2a) and the comb-teeth electrode E1.

The moving part 1 and the first layer 2a of the frame 2 formed in the present step oppose to each other across a separation gap G' to which the insulation layer 13 exposes partially. Each of the connecting parts 3 is in contact with the insulation layer 13, and connects the moving part 1 and the first layer 2a across the separation gap G'. Each of the protective part 4 is in contact with the insulation layer 13, and extends from the moving part 1 or from the first layer 2a into the separation gap G'.

Next, as shown in FIG. 25(a), a sub-carrier 24 is bonded to the silicon layer 11 side of the material substrate 10 via a bonding member 25. Thereafter, as shown in FIG. 25(b), anisotropic etching by DRIE is performed to the silicon layer 12 until the insulation layer 13 is reached, using the oxide film pattern 23 as a mask. In this step, a predetermined etching apparatus equipped with a vacuum chamber is used, and the dry etching operation is performed in the vacuum chamber under predetermined vacuum conditions. This step yields part of the frames F1, F2, F3 (the second layer 2b) and the comb-teeth electrode E2. Also, the present step exposes the insulation layer 13 partially in the silicon layer 12. The exposed portion includes the portions S (double-side exposed portions) which expose also to the separation gap G' on the silicon layer 11 side, portions contacted by the connecting parts C1, C2 (each of the connecting parts 3), and portions contacted by the protective parts P1, P2 (each protective part 4). After this step, the material substrate 10 is separated from the sub-carrier 24.

Next, as shown in FIG. 25(c), exposed areas of the insulation layer 13 and the oxide film patterns 23, 31 are etched off. The etching may be dry etching or wet etching.

By performing the above-described sequence of steps, it is possible to form a moving part M, frames F1, F2, F3, connecting parts C1, C2, protective parts P1, P2, and a set of comb-teeth electrodes E1, E2, and thereby to manufacture a micromirror element X2. The process described with reference to FIG. 23(b) through FIG. 24(c), i.e. a series of micromachining operations performed to the silicon layer 11 represent the first processing step according to the present invention. The process described with reference to FIG. 23(b) and FIG. 25(b), i.e. micromachining operations performed to the silicon layer 12 represent the second processing step according to the present invention.

In the first processing step according to the present method, protective parts 4A which are in contact with the insulation layer 13 and extend from the moving part 1 or from the first layer 2a into the separation gap G' are formed out of the silicon layer 11, along with the connecting parts 3 which are in contact with the insulation layer 13 and provide connection between the moving part 1 and the first layer 2a of the frame 2 across the separation gap G'. As a result, breakage of the connecting parts 3 which are in contact with the insulation layer 13 is reduced under circumstances resulted from the second processing step performed to the portions S (double-side exposed portions) in the insulation layer 13. With the presence of the protective parts, breakage probability of the connecting parts 3 is decreased in the method of manufacturing the micromirror element X2 just as in the method of manufacturing the micromirror element X1, for reasons described with reference to FIG. 12. Therefore, the present method is also suitable for manufacturing micromirror elements (microstructure devices) which include connecting parts 3 that connect a moving part (the first structural part) and the frame (the second structural part).

Figure 26:
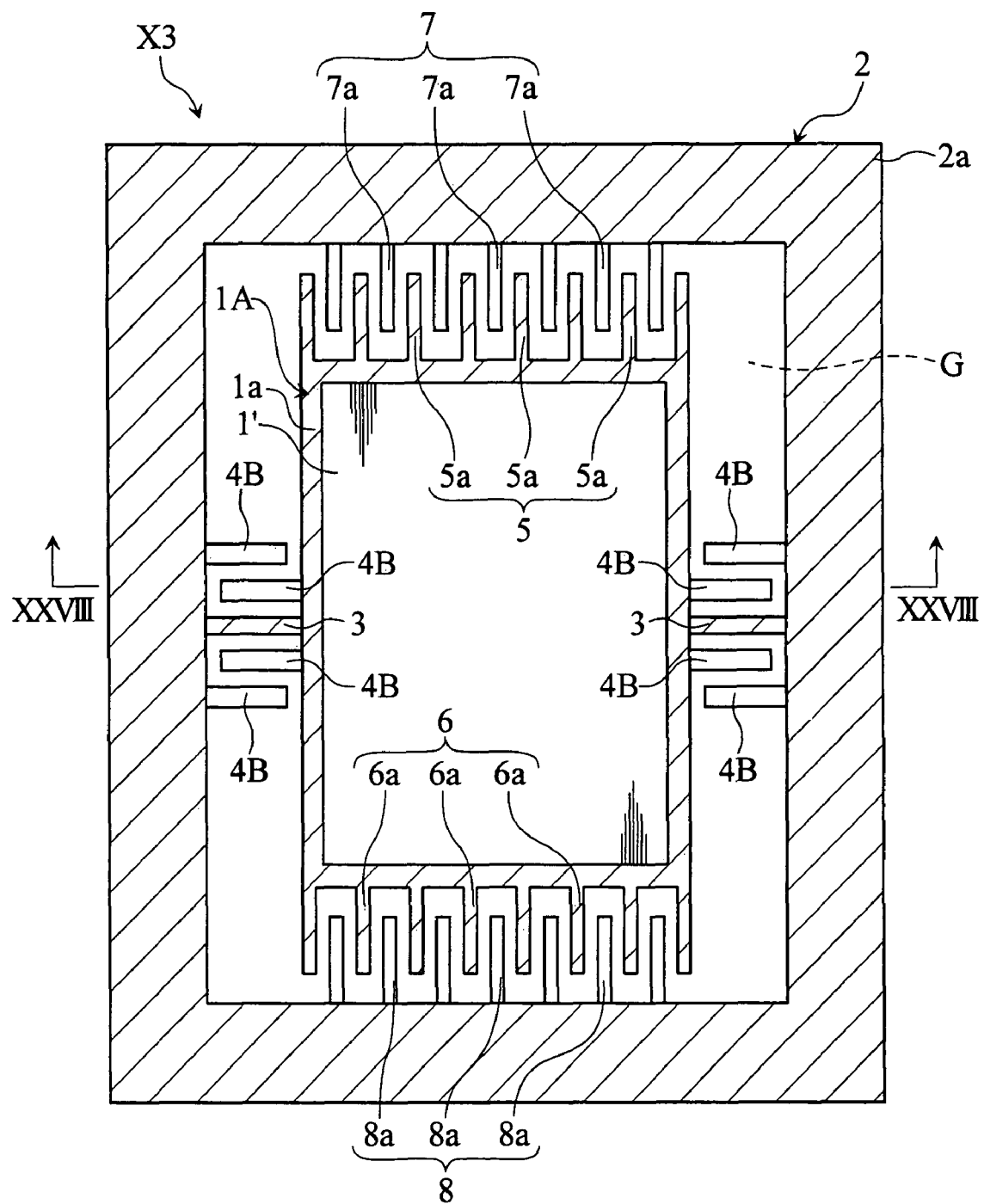
FIG. 26 is a plan view of a micromirror element according to a third embodiment of the present invention.
Figure 27:
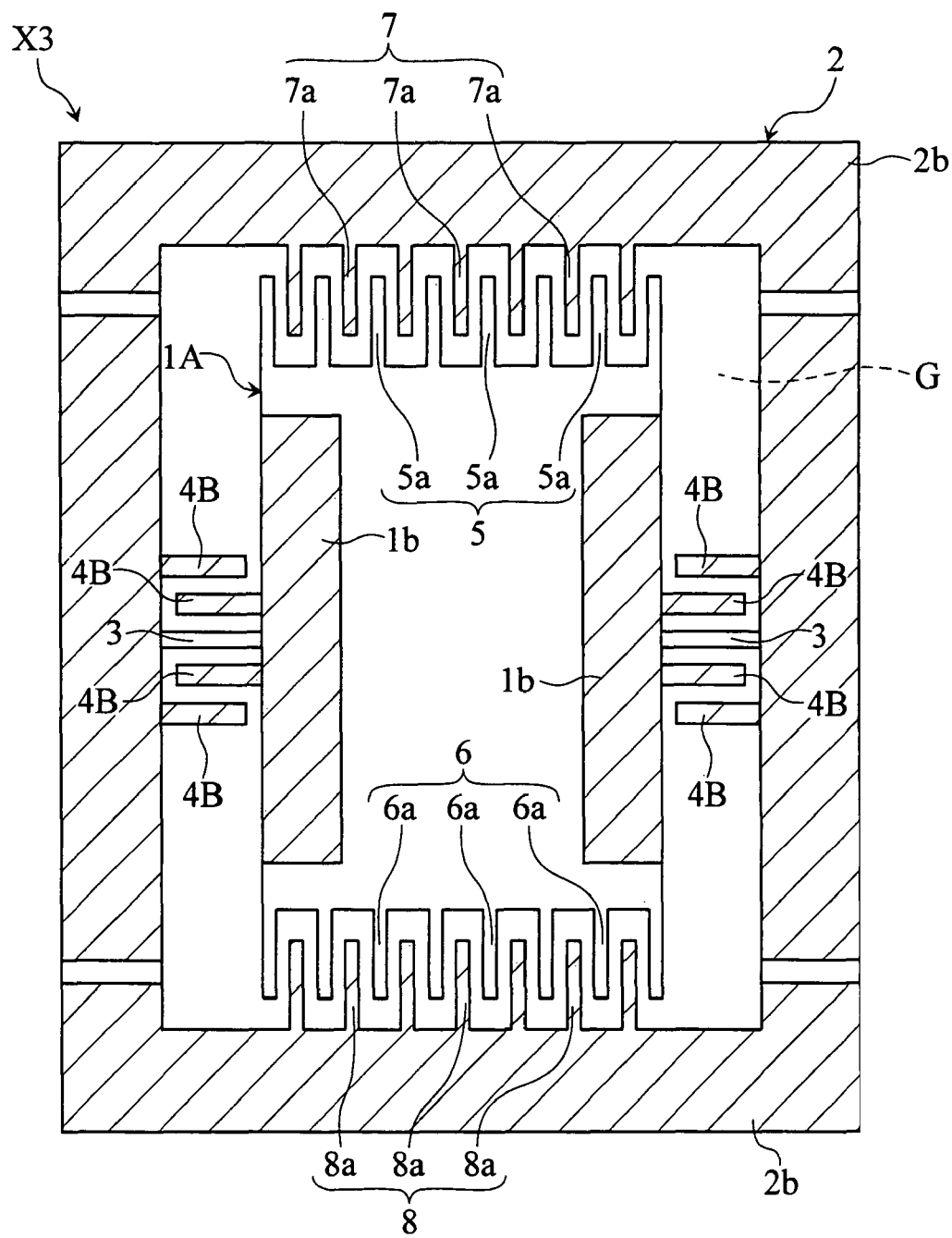
FIG. 27 is another plan view of the micromirror element according to the third embodiment of the present invention.
Figure 28:
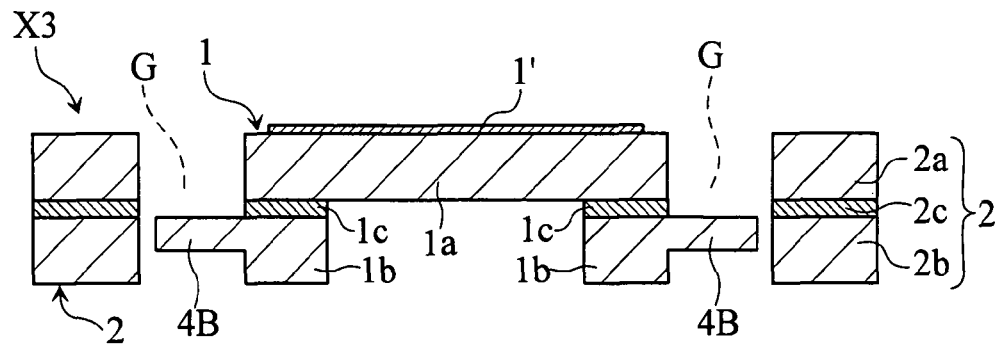
FIG. 28 is a sectional view taken in lines XXVIII-XXVIII in FIG. 26.
Figure 29:
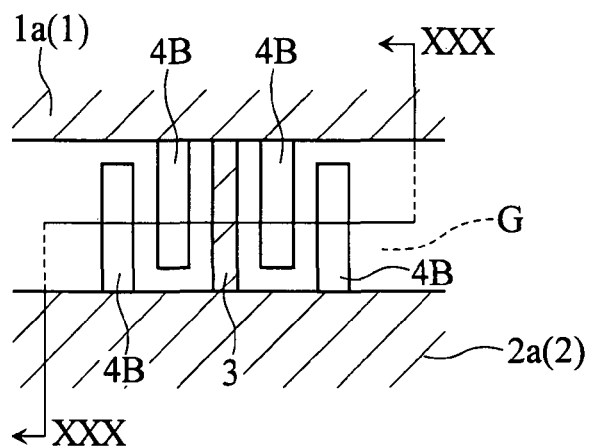
FIG. 29 is an enlarged partial plan view of the micromirror element in FIG. 26.

FIG. 26 through FIG. 28 show a micromirror element X3 according to a third embodiment of the present invention. FIG. 26 is a plan view of the micromirror element X3 whereas FIG. 27 is another plan view of the micromirror element X3. FIG. 28 is a sectional view taken in lines XXVIII-XXVIII in FIG. 26.

The micromirror element X3 includes a moving part 1A, a frame 2, a pair of connecting parts 3, a plurality of protective parts 4B and comb-teeth electrodes 5, 6, 7, 8. The micromirror element X3 differs from the micromirror element X1 only in that it has a moving part 1A instead of a moving part 1 and protective parts 4B instead of protective parts 4, and thus can be driven in the same way as the micromirror element X1.

The moving part 1A has a first layer 1a and a second layer 1b. The first layer 1a is provided with a mirror surface 1' capable of reflecting light. The first layer 1a is a portion derived from the first silicon layer whereas the second layer 1b is a portion derived from the second silicon layer. As shown in FIG. 28, the first layer 1a and the second layer 1b are bonded to each other via an insulation layer 1c. The comb-teeth electrodes 5, 6 of the micromirror element X3 are fixed to the first layer 1a of the moving part 1A.

Figure 30:
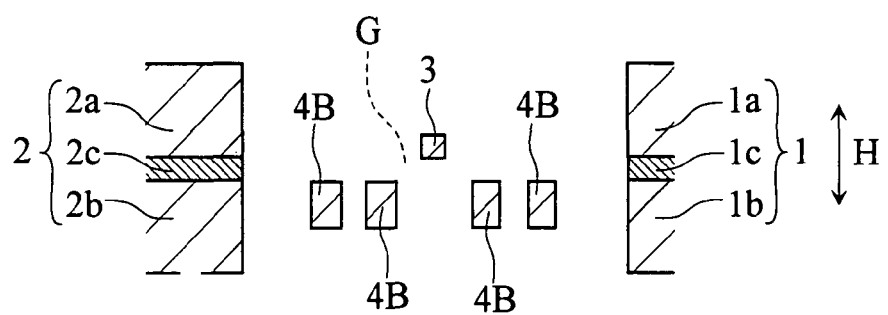
FIG. 30 is a sectional view taken in lines XXX-XXX in FIG. 29.

Each of the protective parts 4B is a portion derived from the second silicon layer 1b, and as shown in FIG. 27 and FIG. 28, extends from the second layer in the moving part 1A toward the frame 2, or from the second layer 2b of the frame 2 toward the moving part 1A. Closely to each of the connecting parts 3, two protective parts 4 extend from the second layer 1b and two protective parts 4 extending from the second layer 2b. As shown in FIG. 30 for example, each of the protective parts 4 is thinner than the second layer 1b of the moving part 1A and the second layer 2b of the frame 2 in the thickness direction H of the element.

Figure 31:
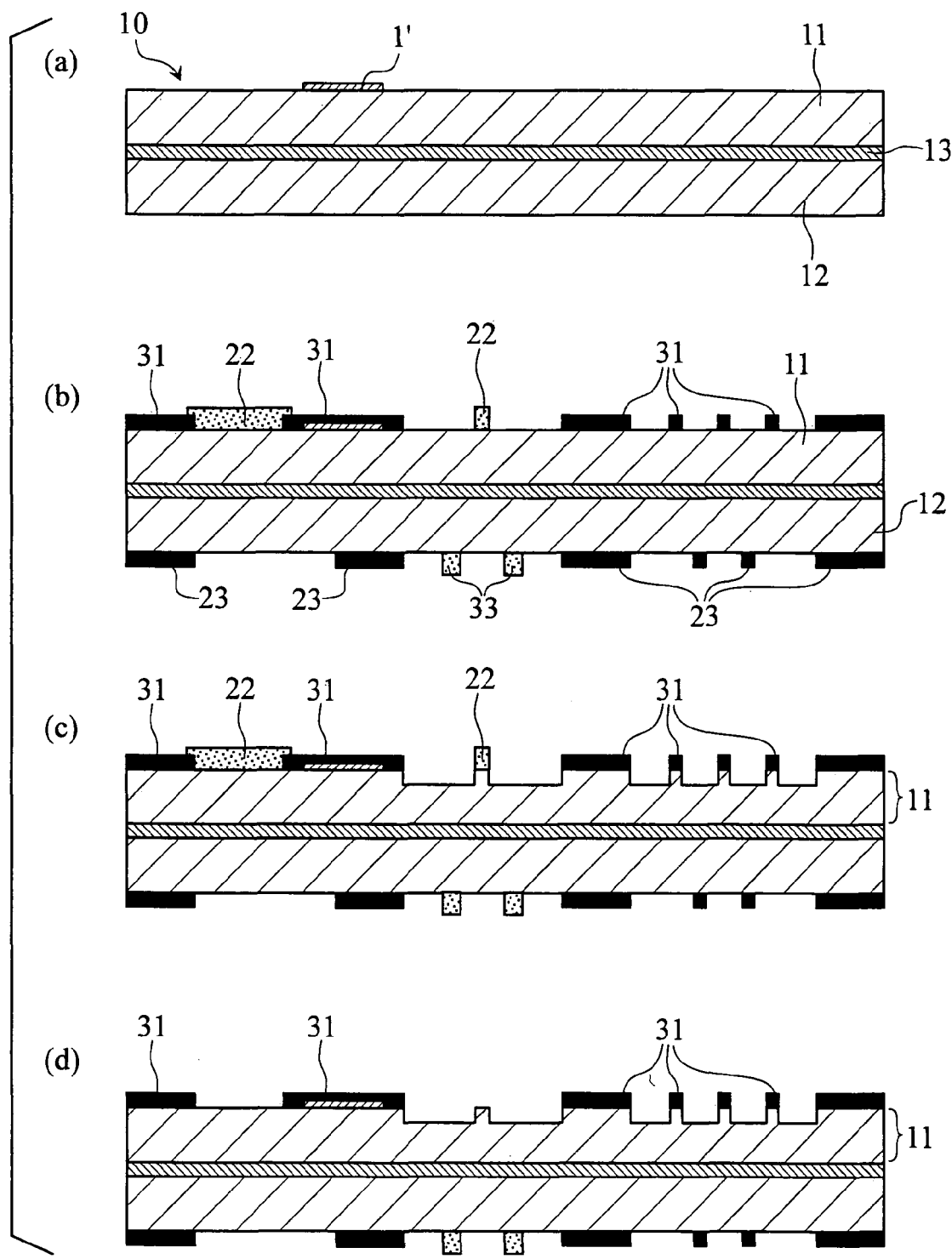
FIG. 31 shows steps in a method for manufacturing the micromirror element in FIG. 26.
Figure 32:
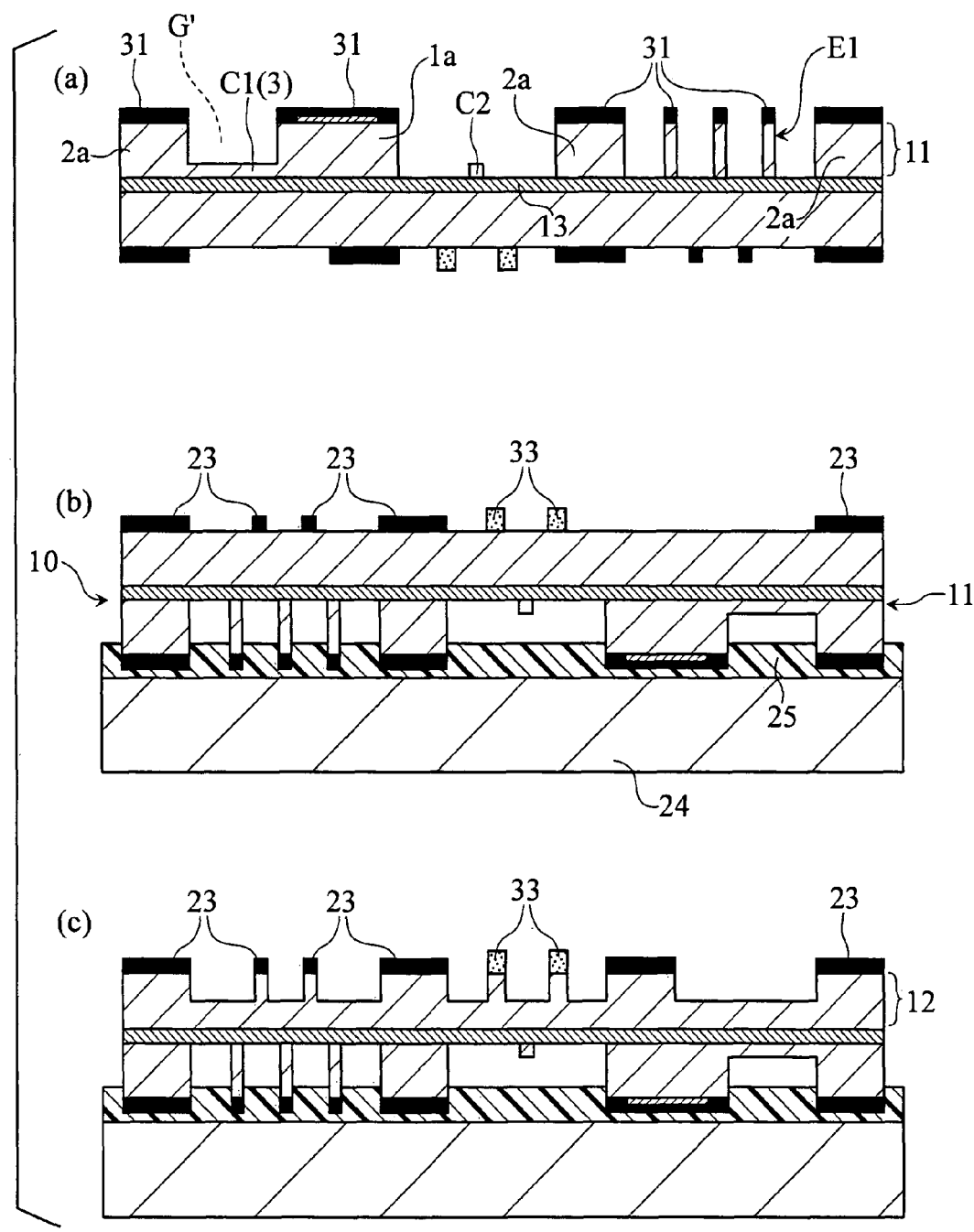
FIG. 32 shows steps continued from FIG. 3.
Figure 33:
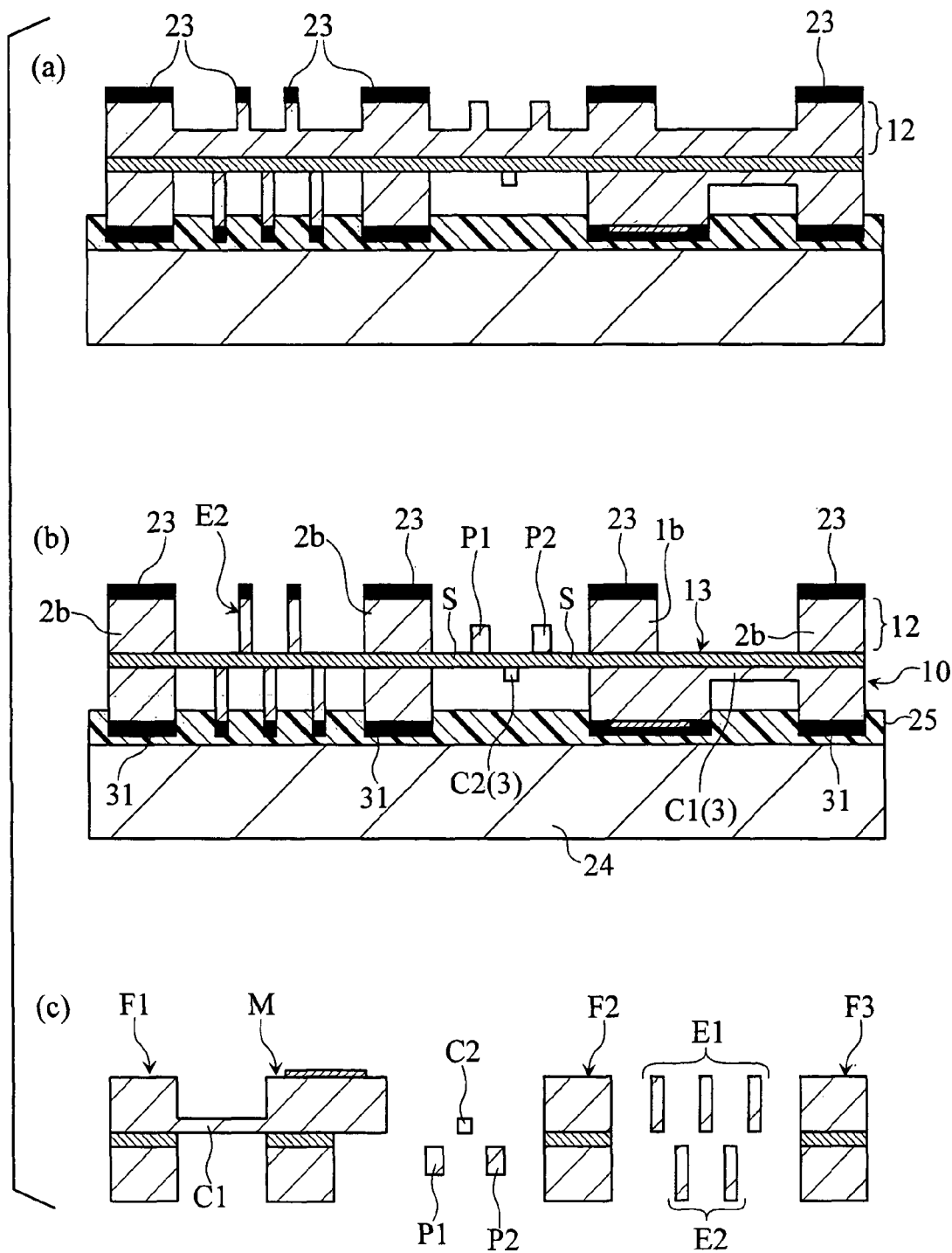
FIG. 33 shows steps continued from FIG. 32.

FIG. 31 through FIG. 33 show a method of making the micromirror element X3. The method is an example of how the micromirror element X3 can be manufactured through micromachining technology. FIG. 31 through FIG. 33 show a section in a series, illustrating a formation process of various parts shown in FIG. 33(c), i.e. a moving part M, frames F1, F2, F3, connecting parts C1, C2, protective parts P1, P2, and a set of comb-teeth electrodes E1, E2. The section featured in the figures is a conceptual composite collected from a plurality of fragmentary sections of a material wafer to which a series of manufacturing operations are made to form a single micromirror element. The protective parts P1, P2, each representing the protective part 4B, are cross-sections of the protective part 4B. The moving part M, the frames F1, F2, F3, the connecting parts C1, C2 and the comb-teeth electrodes E1, E2 are formed in the same way as described for the micromirror element X1.

In the manufacture of the micromirror element X3, first, a mirror surface 1' is formed on a material substrate 10 as shown in FIG. 31(a). The material substrate 10 is the same as in the first embodiment, having a laminated structure provided by silicon layers 11, 12 and an insulation layer 13.

Next, as shown in FIG. 31(b), an oxide film pattern 31 and a resist pattern 22 are formed on the silicon layer 11, and an oxide film pattern 23 and a resist pattern 33 are formed on the silicon layer 12. The oxide film pattern 31 has a pattern for forming the moving part M, the frames F1, F2, F3, and the comb-teeth electrode E1 as in the method of manufacturing the micromirror element X2 described earlier. The resist pattern 22 has a pattern for forming the connecting parts C1, C2 as described earlier in relation to the method of manufacturing the micromirror element X1. The oxide film pattern 23 has a pattern for forming the frames F1, F2, F3 and the comb-teeth electrode E2 as described earlier in relation to the method of manufacturing the micromirror element X1.

Next, as shown in FIG. 31(c), anisotropic dry etching by DRIE is performed to the silicon layer 11 to a predetermined depth, with masks provided by the oxide film pattern 31 and the resist pattern 22. The predetermined depth is a depth equal to the thickness of the connecting parts C1, C2, being 5 μm for example. Thereafter, as shown in FIG. 31(d), the resist pattern 22 is removed by remover.

Next, as shown in FIG. 32(a), using the oxide film pattern 31 as a mask, anisotropic etching by DRIE is performed to the silicon layer 11 until the insulation layer 13 is reached while leaving the thin connecting parts C1, C2 which contact the insulation layer 13. In this step, a predetermined etching apparatus equipped with a vacuum chamber is used, and the dry etching operation is performed in the vacuum chamber under predetermined vacuum conditions. This step yields the connecting parts C1, C2, as well as part of the moving part M (the first layer 1a), part of the frames F1, F2, F3 (the first layer 2a), and the comb-teeth electrode E1.

The first layer 1a of the moving part 1A and the first layer 2a of the frame 2 formed in the present step oppose to each other across a separation gap G' to which the insulation layer 13 exposes partially. Each of the connecting parts 3 is in contact with the insulation layer 13, and connects the moving part 1 and the first layer 2a across the separation gap G'.

Next, as shown in FIG. 32(b), a sub-carrier 24 is bonded to the silicon layer 11 side of the material substrate 10 via a bonding member 25. Thereafter, as shown in FIG. 32(c), using the oxide film pattern 23 and the resist pattern 33 as masks, anisotropic dry etching by DRIE is performed to the silicon layer 12 to a predetermined depth. The predetermined depth is a depth equal to the thickness of the protective part P1, P2, being 5 through 55 μm for example. This step uses a predetermined etching apparatus equipped with a vacuum chamber to perform the dry etching in the vacuum chamber under predetermined vacuum conditions. Thereafter, the resist pattern 33 is removed with remover as shown in FIG. 33(a).

Next, as shown in FIG. 33(b), using the oxide film pattern 23 as a mask, anisotropic dry etching by DRIE is performed to the silicon layer 12 until the insulation layer 13 is reached while leaving the protective part P1, P2 which contact the insulation layer 13. In this step, a predetermined etching apparatus equipped with a vacuum chamber is used, and the dry etching operation is performed in the vacuum chamber under predetermined vacuum conditions. This step yields the protective parts P1, P2 as well as part of the moving part M (second layer 1b), part of the frames F1, F2, F3 (second layer 2b), and the comb-teeth electrode E2. Also, the present step exposes the insulation layer 13 partially in the silicon layer 12. The exposed portion includes portions S (double-side exposed portions) which are exposed also to the separation gap G' on the silicon layer 11, and portions contacted by the connecting parts C1, C2 (each of the connecting parts 3). After this step, the material substrate 10 is separated from the sub-carrier 24.

Next, as shown in FIG. 33(c), exposed areas of the insulation layer 13 and the oxide film patterns 23, 31 are etched off. The etching may be dry etching or wet etching.

By performing the above-described sequence of steps, it is possible to form a moving part M, frames F1, F2, F3, connecting parts C1, C2, protective parts P1, P2, and a set of comb-teeth electrodes E1, E2, and thereby to manufacture a micromirror element X3. The process described with reference to FIG. 31(b) through FIG. 32(a), i.e. a series of micromachining operations performed to the silicon layer 11 represent the first processing step according to the present invention. The process described with reference to FIG. 31(b) and FIG. 32(b) through FIG. 33(b), i.e. micromachining operations performed to the silicon layer 12 represent the second processing step according to the present invention.

In the second processing step according to the present method, protective parts 4B which are in contact with the insulation layer 13 and extend from the first layer 1b of the moving part 1A or from the second layer 2b of the frame 2 are formed out of the silicon layer 12. These protective parts 4B are in contact with the silicon layer 12 side of the insulation layer 13, at places where the insulation layer exposes itself to the separation gap G' on the silicon layer 11 side. As a result, breakage of the connecting parts 3 which contact the insulation layer 13 is reduced under circumstances resulted from the second processing step performed to the portions S (double-side exposed portions) in the insulation layer 13. With the presence of the protective parts, breakage probability of the connecting parts 3 is decreased in the method of manufacturing the micromirror element X3 just as in the method of manufacturing the micromirror element X1, for reasons described with reference to FIG. 12. Therefore, the present method is also suitable for manufacturing micromirror elements (microstructure devices) which include connecting parts 3 that connect a moving part (the first structural part) and the frame (the second structural part).

Figure 34:
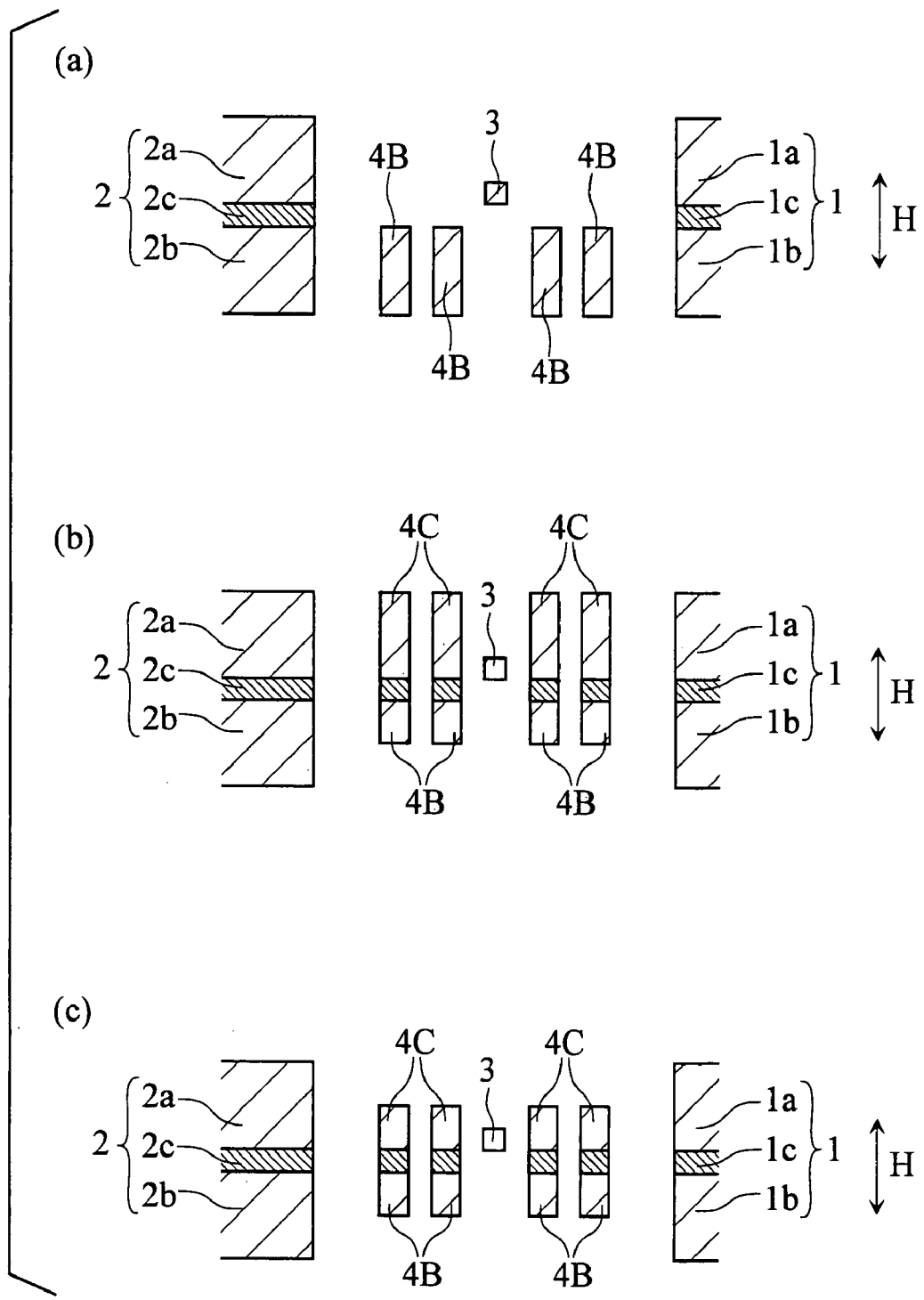
FIG. 34 (a) through FIG. 34 (c) are enlarged partial sectional views each showing a variation of the micromirror element in FIG. 26 and corresponding to FIG. 30.
Figure 35:
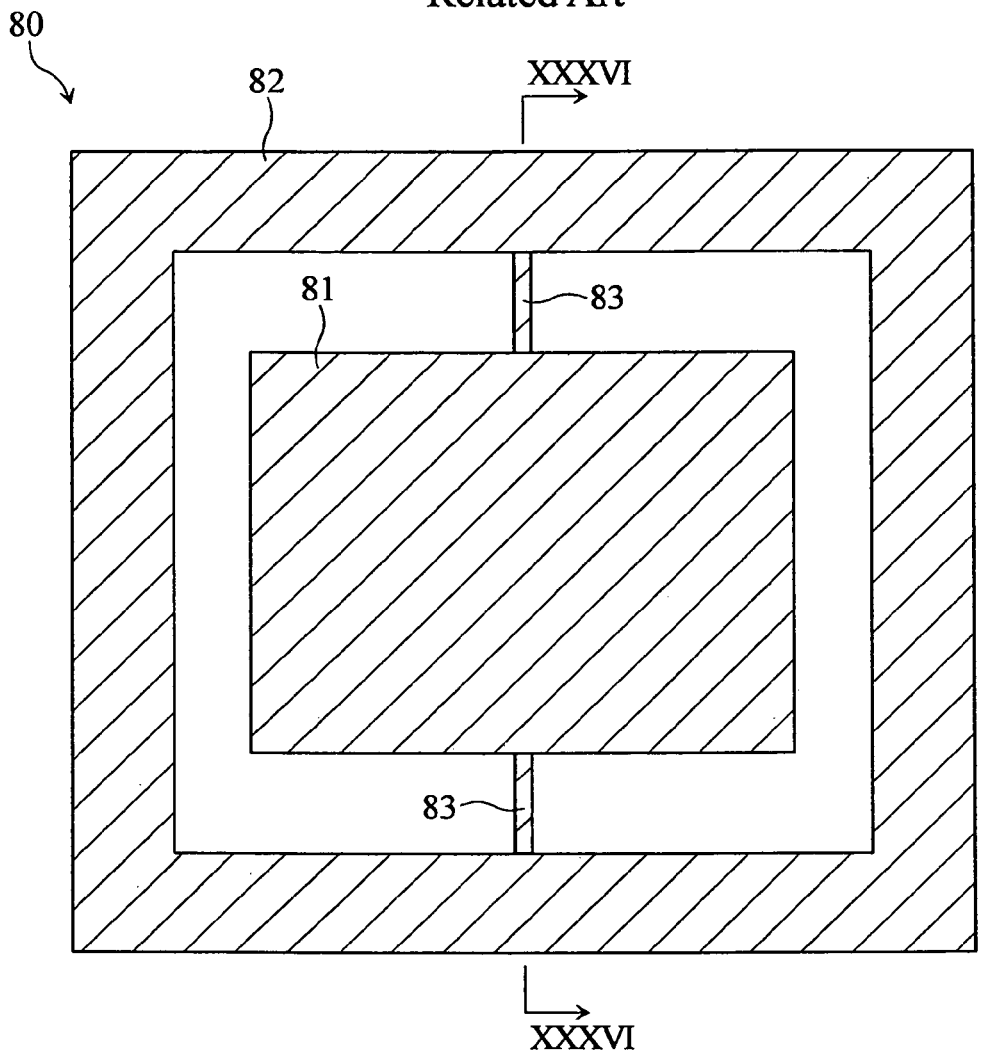
FIG. 35 is a plan view of a conventional microstructure device.
Figure 36:
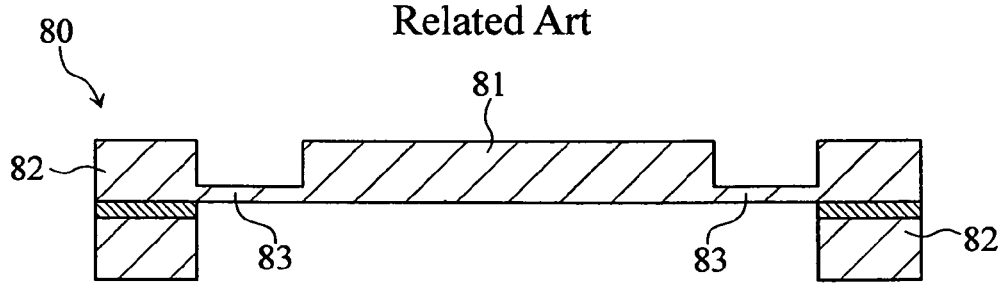
FIG. 36 is a sectional view taken in lines XXXVI-XXXVI in FIG. 35.
Figure 37:
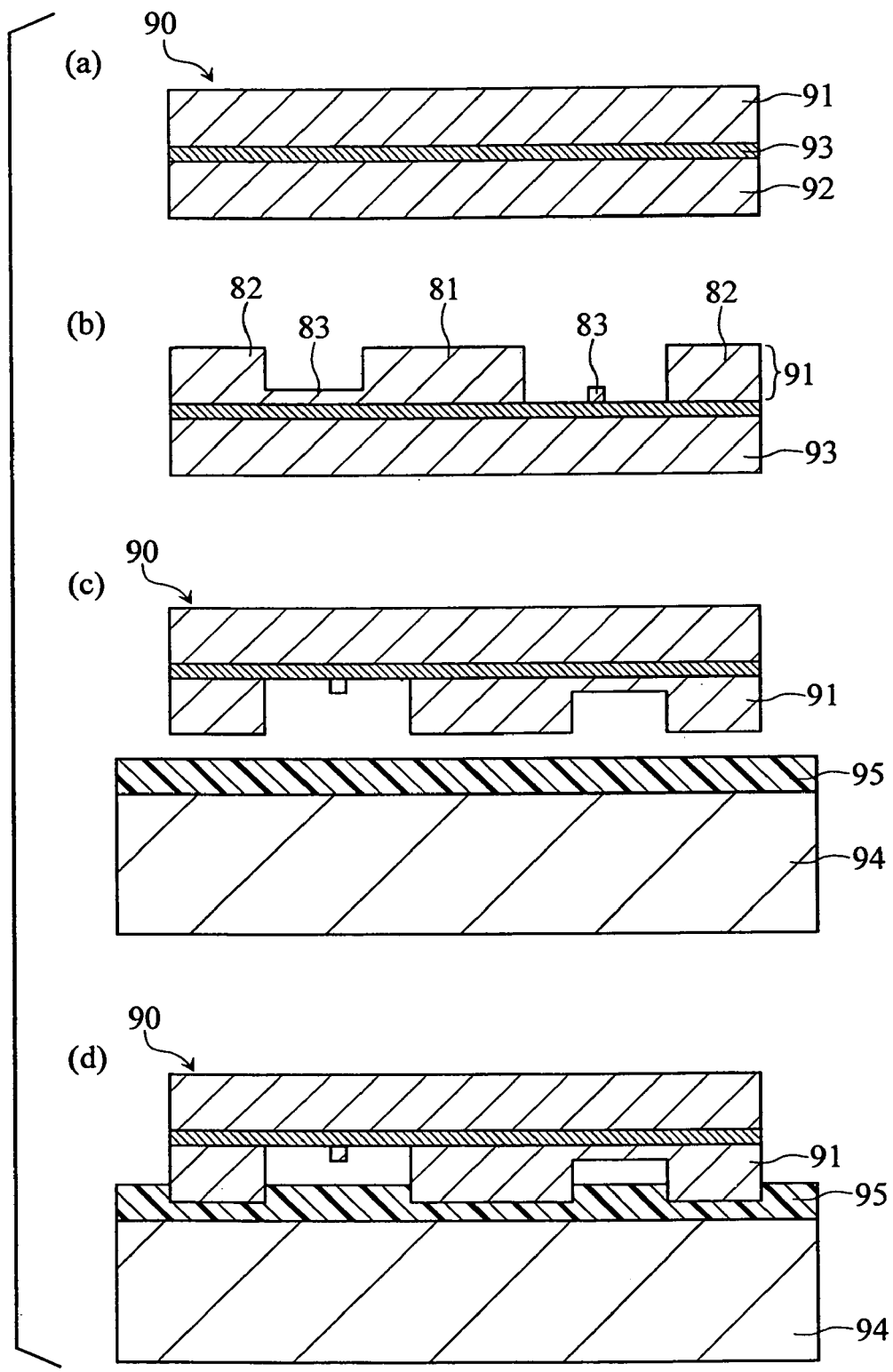
FIG. 37 shows steps in a method of manufacturing the micromirror element in FIG. 35.
Figure 38:
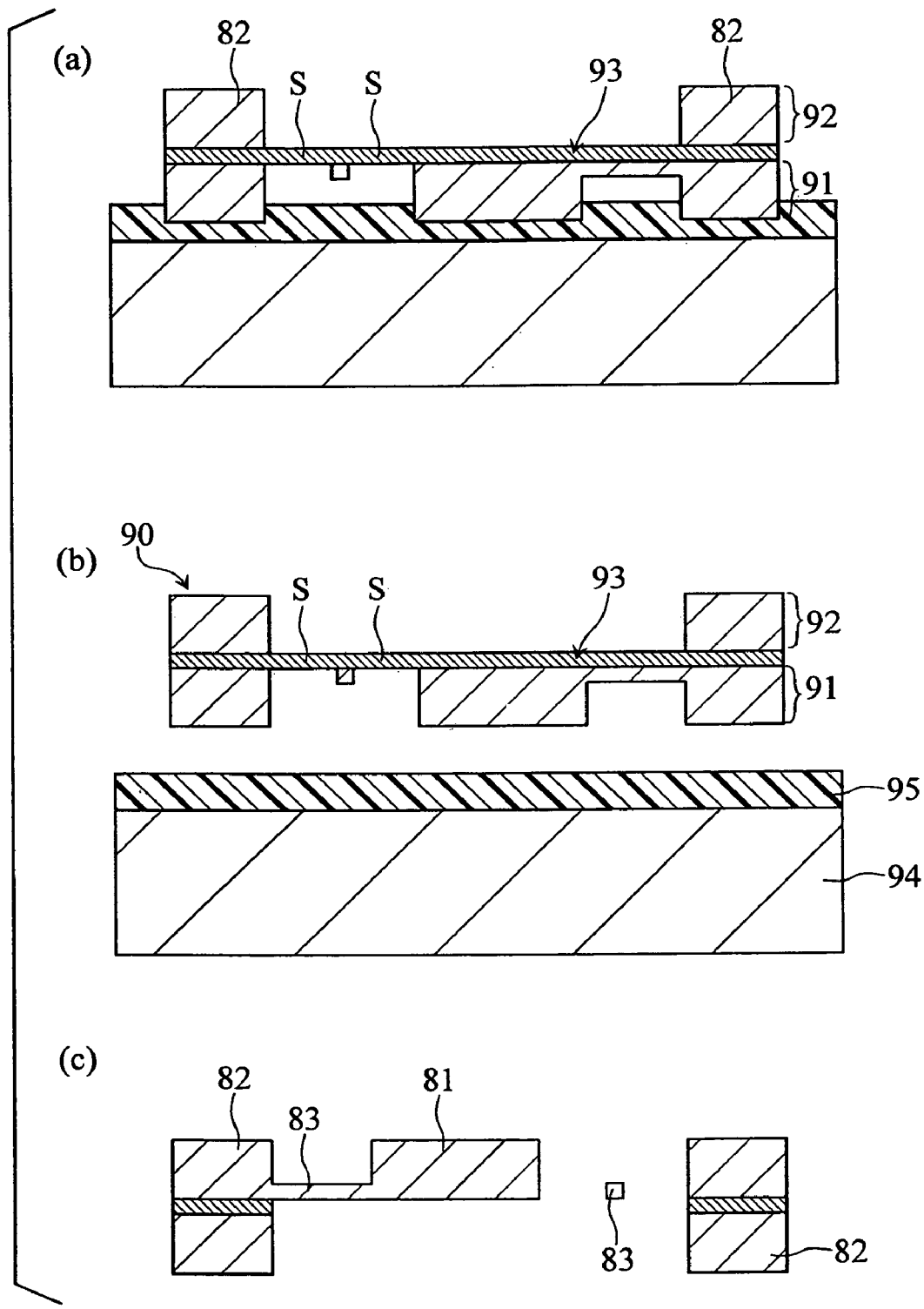
FIG. 38 shows steps continued from FIG. 37.
Figure 39:
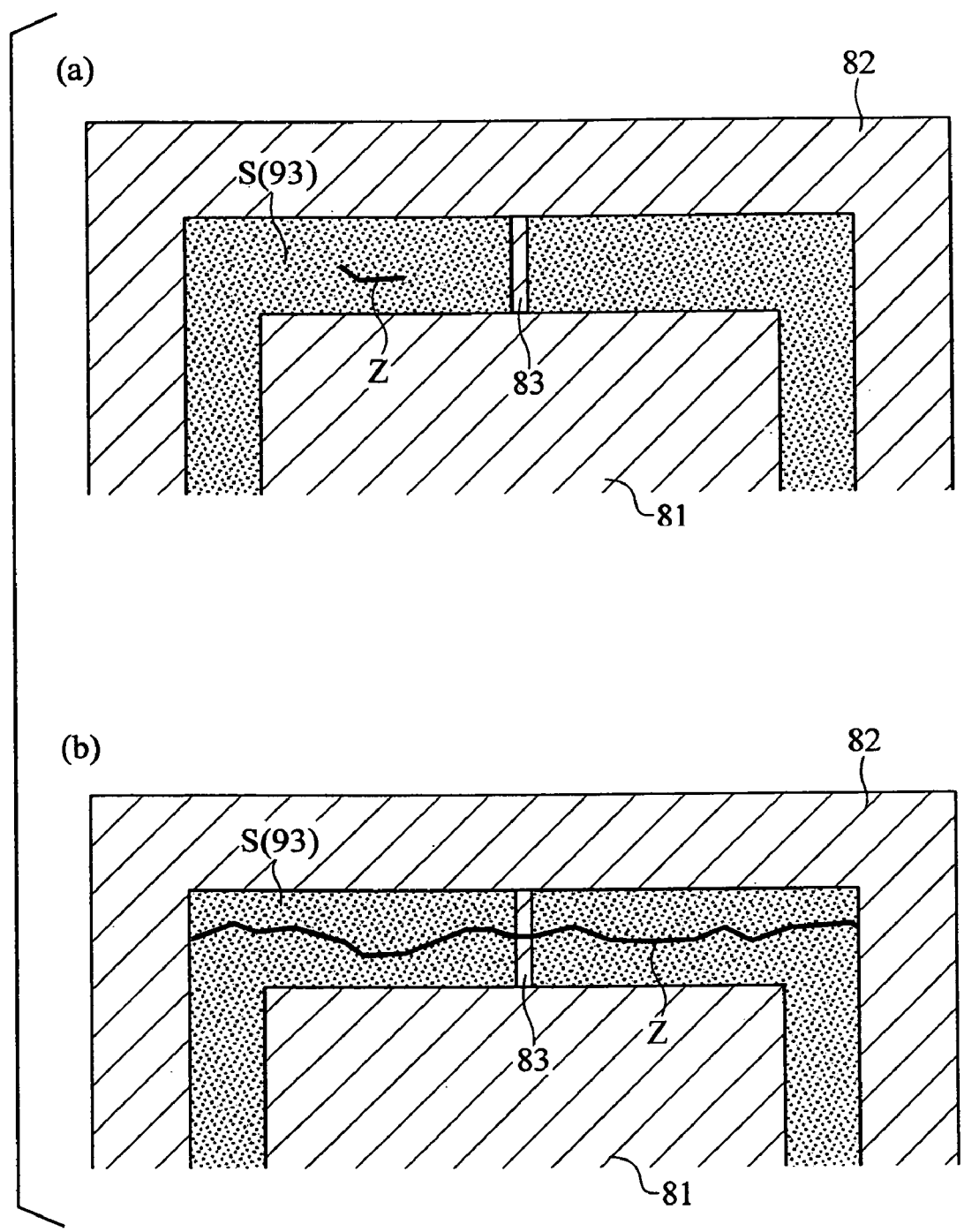
FIG. 39 illustrates a case where a connecting part is cracked.

As shown in FIG. 34(a), in the micromirror element X3, each of the protective parts 4B may have the same thickness as the second layer 1b of the moving part 1A and the second layer 2b of the frame 2. Thick protective parts 4B such as these can be formed in the same way as the thick second layers 1b, 2b.

As shown in FIG. 34(b) and FIG. 34(c), the micromirror element X3 may also include protective parts 4C in addition to the protective parts 4B. Each of the protective parts 4C extends from the first layer 1a of the moving part 1A or the first layer 2a of the frame 2. The protective parts 4B which extend from the second layer 1b of the moving part 1A are connected with the protective parts 4C which extend from the first layer 1a of the moving part 1A, via an insulation layer. The protective parts 4B which extend from the second layer 2b of the frame 2 are connected with the protective parts 4C which extend from the first layer 2a of the frame 2, via an insulation layer. The protective parts 4C in FIG. 34(b) have the same thickness as the first layers 1a, 2a in the thickness direction H of the element. The protective parts 4C in FIG. 34(c) have a thickness which is thinner than the first layers 1a, 2a and thicker than the connecting parts 3.

The invention claimed is:

1. A microstructure device comprising:
    a material substrate including a first process layer, a second process layer and a middle layer between the first process layer and the second process layer;
    a first structural part;
    a second structural part including a portion facing the first structural part via a gap;
    a connecting part formed in the first process layer to be in contact with the middle layer, the connecting part being arranged to connect the first structural part and the second structural part to each other across the gap; and
    a plurality of protective parts formed in one of the first process layer and the second process layer to be in contact with the middle layer, the protective parts extending toward one of the first structural part and the second structural part, the protective parts being disposed on both sides of and parallel to the connecting part;
    wherein the connecting part provides a pivotal axis for pivotal movement of the first structural part about the pivotal axis.

2. The microstructure device according to claim 1, wherein the protective parts include a first protective part and a second protective part, the first protective part extending from the first structural part toward the second structural part, the second protective part extending from the second structural part toward the first structural part.

3. The microstructure device according to claim 1, wherein the connecting part is thinner than the first structural part and the second structural part.

4. The microstructure device according to claim 1, wherein each of the protective parts is thinner than the first structural part and the second structural part.

5. The microstructure device according to claim 1, wherein each of the protective parts is thicker than the connecting part.

6. The microstructure device according to claim 1, wherein each of the protective parts is wider than the connecting part.

7. The microstructure device according to claim 1, wherein the first structural part is a movable part, and the second structural part is a fixed part.

8. The microstructure device according to claim 7, further comprising a first comb-teeth electrode and a second comb-teeth electrode, the first comb-teeth electrode being fixed to the movable part, the second comb-teeth electrode being fixed to the fixed part and brought into facing relation to the first comb-teeth electrode.

9. The microstructure device according to claim 8, wherein the first comb-teeth electrode and the second comb-teeth electrode cooperate as a driving force generator for generating electrostatic attraction between the first and the second comb-teeth electrodes.

10. The microstructure device according to claim 8, wherein the first comb-teeth electrode and the second comb-teeth electrode cooperate as a detector for detecting change in electrostatic capacity between the first comb-teeth electrode and the second comb-teeth electrode.

11. The microstructure device according to claim 7, wherein the connecting part serves as a supporting part for temporarily fixing the movable part to the fixed part.

* * * * *